US012757785B2

(12) United States Patent
Lin et al.

(10) Patent No.: US 12,757,785 B2
(45) Date of Patent: Oct. 6, 2026

(54) DISPLAY DEVICE

(71) Applicant: Ennostar Corporation, Hsinchu City (TW)

(72) Inventors: Chih-Hao Lin, Hsinchu (TW); Wei-Yuan Ma, Hsinchu (TW); Jo-Hsiang Chen, Hsinchu (TW)

(73) Assignee: Ennostar Corporation, Hsinchu City (TW)

( * ) Notice: Subject to any disclaimer, the term of this patent is extended or adjusted under 35 U.S.C. 154(b) by 956 days.

(21) Appl. No.: 17/822,140

(22) Filed: Aug. 25, 2022

(65) Prior Publication Data

US 2023/0111709 A1 Apr. 13, 2023

(30) Foreign Application Priority Data

Sep. 30, 2021 (TW) ................................ 110136605

(51) Int. Cl.
*H10W 90/00* (2026.01)
*H10H 20/857* (2025.01)

(52) U.S. Cl.
CPC .......... *H10W 90/00* (2026.01); *H10H 20/857* (2025.01)

(58) Field of Classification Search
CPC ............................ H10W 90/00; H10H 20/857
See application file for complete search history.

(56) References Cited

U.S. PATENT DOCUMENTS 5,341,153 A 8/1994 Benzschawel et al.
6,188,385 B1 2/2001 Hill et al.
10,089,908 B2 10/2018 Chen et al.
10,546,913 B2 * 1/2020 Lee ........................ H10K 59/18
10,818,644 B2 10/2020 Chang et al.
2004/0212633 A1 10/2004 Natori et al.
2016/0121073 A1 * 5/2016 Mok .................... G09G 3/2003 345/694
2017/0193880 A1 * 7/2017 Lee ...................... G09G 3/2003
2017/0286044 A1 * 10/2017 Kim ..................... G09G 3/3208
2019/0115390 A1 * 4/2019 Lai .......................... H01L 22/20
2020/0043989 A1 * 2/2020 Liu ...................... H10K 59/353
(Continued)

FOREIGN PATENT DOCUMENTS

CN 1491409 A 4/2004
CN 101359120 A 2/2009
(Continued)

OTHER PUBLICATIONS

File:Subpixel rendering RGB-GBR alternated geometry.png, https://commons.wikimedia.org/wiki/File: Subpixel_rendering_RGB-GBR_alternated_geometry.png, This page was last edited on Dec. 7, 2020, at 13:54.

*Primary Examiner* — Su C Kim
(74) *Attorney, Agent, or Firm* — CKC & Partners Co., LLC

(57) ABSTRACT

A display device includes a plurality of first packages and a plurality of second packages. The first packages are arranged on the substrate and each of the first packages includes a plurality of first light-emitting chips. The second packages are arranged on the substrate and each of the second packages includes a plurality of second light-emitting chips. The first packages and the second packages are alternately arranged in a first direction, and an arrangement of the first light-emitting chips of the first packages is different from an arrangement of the second light-emitting chips of the second packages.

18 Claims, 13 Drawing Sheets

(56) References Cited

U.S. PATENT DOCUMENTS

| | | | | |
|---|---|---|---|---|
| 2020/0067009 | A1 | 2/2020 | Wu et al. | |
| 2022/0013381 | A1* | 1/2022 | Tsai | H01L 25/0753 |
| 2022/0059015 | A1* | 2/2022 | Su | G09G 3/2096 |

FOREIGN PATENT DOCUMENTS

| | | | |
|---|---|---|---|
| CN | 103594054 | A | 2/2014 |
| CN | 104659064 | A | 5/2015 |
| CN | 107240355 | A | 10/2017 |
| CN | 211742531 | U | 10/2020 |
| CN | 112216219 | A | 1/2021 |
| CN | 112805835 | A | 5/2021 |
| TW | 201507130 | A | 2/2015 |
| TW | 202024746 | A | 7/2020 |
| WO | 2016/115040 | A1 | 7/2016 |

* cited by examiner

DISPLAY DEVICE

CROSS-REFERENCE TO RELATED APPLICATION

This application claims priority to Taiwan Application Serial Number 110136605, filed Sep. 30, 2021, which is herein incorporated by reference in its entirety.

BACKGROUND

Field of Invention

The present disclosure relates to a display device, especially an arrangement of light-emitting diode chips.

Description of Related Art

In recent years, the requirement of the consumer market for high-quality display is gradually increasing. Scaling of light-emitting diode panel are developing towards a direction of panels with small pitches or extremely small pitches. There is a tendency that much smaller light-emitting diode (such as micro light-emitting diode) are used when pitches between pixels are getting smaller and resolution is getting higher. The specifications of the central wavelength and the brightness of the chips are more limited. At this stage, because there is no breakthrough in uniformity of the wavelength and the brightness of epitaxial chips, many chips out of specification are unable to be used in production. The usages of the original light-emitting diode chips significantly decrease, such that costs of light-emitting diode panels keep high.

SUMMARY

Some embodiments of the present disclosure provide a display device. The display device includes a carrier; a plurality of first packages on the carrier and a plurality of second packages on the carrier. Each of the first packages includes a plurality of first light-emitting diode chips. Each of the second packages includes a plurality of second light-emitting diode chips. The first packages and the second packages are alternately arranged along a first direction, and an arrangement of the first light-emitting diode chips of the first packages are different from an arrangement of the second light-emitting diode chips of the second packages.

According to some embodiments, the first light-emitting diode chips of the first packages are adjacent to the second light-emitting diode chips of the second packages with similar wavelengths.

According to some embodiments, the first light-emitting diode chips of each of the first packages include a first green light-emitting diode chip, a first red light-emitting diode chip, and a first blue light-emitting diode chip. The first blue light-emitting diode chip, the first red light-emitting diode chip, and the first green light-emitting diode chip are arranged along the first direction. The second light-emitting diode chips of each of the second packages include a second green light-emitting diode chip, a second red light-emitting diode chip, and a second blue light-emitting diode chip. The second green light-emitting diode chip, the second red light-emitting diode chip and the second blue light-emitting diode chip are arranged along the first direction.

According to some embodiments, a connecting line of centers of the first green light-emitting diode chip, the first red light-emitting diode chip and the first blue light-emitting diode chip of each of the first packages is parallel to the first direction.

According to some embodiments, the first green light-emitting diode chip is adjacent to the second green light-emitting diode chip.

According to some embodiments, the first packages and the second packages are further arranged along a second direction, and the second direction is different from the first direction.

According to some embodiments, a connecting line of centers of the first green light-emitting diode chip, the first red light-emitting diode chip and the first blue light-emitting diode chip and the first direction forms an acute angle.

According to some embodiments, the first packages are further arranged along a second direction different from the first direction.

According to some embodiments, the first light-emitting diode chips of the first packages are adjacent to the second light-emitting diode chips of the second packages with similar wavelengths.

According to some embodiments, the first green light-emitting diode chip and the first blue light-emitting diode chip of each of the first packages are at opposite corners of each of the first packages.

According to some embodiments, the second green light-emitting diode chip and the second blue light-emitting diode chip of each of the second packages are at opposite corners of each of the second packages, and the second blue light-emitting diode chip is aligned with the first blue light-emitting diode chip in the first direction.

According to some embodiments, the first blue light-emitting diode chip is adjacent to the second blue light-emitting diode chip.

According to some embodiments, a number of the first light-emitting diode chips of each of the first packages is more than a number of the second light-emitting diode chips of each of the second packages.

According to some embodiments, the first light-emitting diode chips of each of the first packages include a first green light-emitting diode chip, a first red light-emitting diode chip, and a first blue light-emitting diode chip. The first green light-emitting diode chip, the first red light-emitting diode chip and the first blue light-emitting diode chip are arranged along a second direction different from the first direction. The second light-emitting diode chips of each of the second packages include a second green light-emitting diode chip and a second blue light-emitting diode chip. The second green light-emitting diode chip and the second blue light-emitting diode chip are arranged along the second direction, and the first packages are further arranged along the first direction.

According to some embodiments, the first green light-emitting diode chip and the first blue light-emitting diode chip are at a first side of the first package, and the first red light-emitting diode chip is at a second side opposite to the first side of the first package.

According to some embodiments, the first light-emitting diode chips of the first packages are adjacent to the second light-emitting diode chips of the second packages with similar wavelengths.

According to some embodiments, the first green light-emitting diode chip is adjacent to the second green light-emitting diode chip and the first blue light-emitting diode chip is adjacent to the second blue light-emitting diode chip.

According to some embodiments, the display device further includes a plurality of third packages on the carrier.

Each of the third packages includes a plurality of third light-emitting diode chips. The first packages and the third packages are arranged along the second direction, and the arrangement of the first light-emitting diode chips of the first packages are different from an arrangement of the third light-emitting diode chips of the third packages.

According to some embodiments, the first light-emitting diode chips of the first packages are adjacent to the third light-emitting diode chips of the third packages with similar wavelengths.

According to some embodiments, the third light-emitting diode chips of each of the third packages includes a third green light-emitting diode chip, a third red light-emitting diode chip and a third blue light-emitting diode chip. The third blue light-emitting diode chip, the third red light-emitting diode chip and the third green light-emitting diode chip are arranged along the second direction.

According to some embodiments, the third green light-emitting diode chip and the third blue light-emitting diode chip are aligned with the first green light-emitting diode chip and the first blue light-emitting diode chip along the second direction and are not aligned with the first red light-emitting diode chip.

According to some embodiments, the third green light-emitting diode chip is adjacent to the first green light-emitting diode chip.

According to some embodiments, the third green light-emitting diode chip is adjacent to the first green light-emitting diode chip and the third blue light-emitting diode chip is adjacent to the first blue light-emitting diode chip.

According to some embodiments, the display device further includes a plurality of fourth packages on the carrier. Each of the fourth packages includes a plurality of fourth light-emitting diode chips. The second packages and the fourth packages are arranged along the second direction, and the arrangement of the second light-emitting diode chips of the second packages are different from an arrangement of the fourth light-emitting diode chips of the fourth packages.

According to some embodiments, the fourth light-emitting diode chips of each of the fourth packages include a fourth green light-emitting diode chip and a fourth blue light-emitting diode chip. The fourth blue light-emitting diode chip and the fourth green light-emitting diode chip are arranged along the second direction.

According to some embodiments, during a display operation, one of the first packages is adjacent to one of the second packages, according to a display information, said one of the first packages forms a pixel, and the first red light-emitting diode chip of said one of the first packages is configured to cooperate with the second blue light-emitting diode chip and the second green light-emitting diode chip of said one of the second packages adjacent to said one of the first packages to form anther pixel.

As mentioned above, arranging light-emitting diode chips with similar wavelength together may develop light mixing effect to improve the mosaic or color difference issue. Moreover, using the arrangement of the light-emitting diode chips according to some embodiments of the disclosure may relax the specifications of the light-emitting diodes chips, thereby reducing the elimination rate of the light-emitting diode chips and reducing the manufacturing cost.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
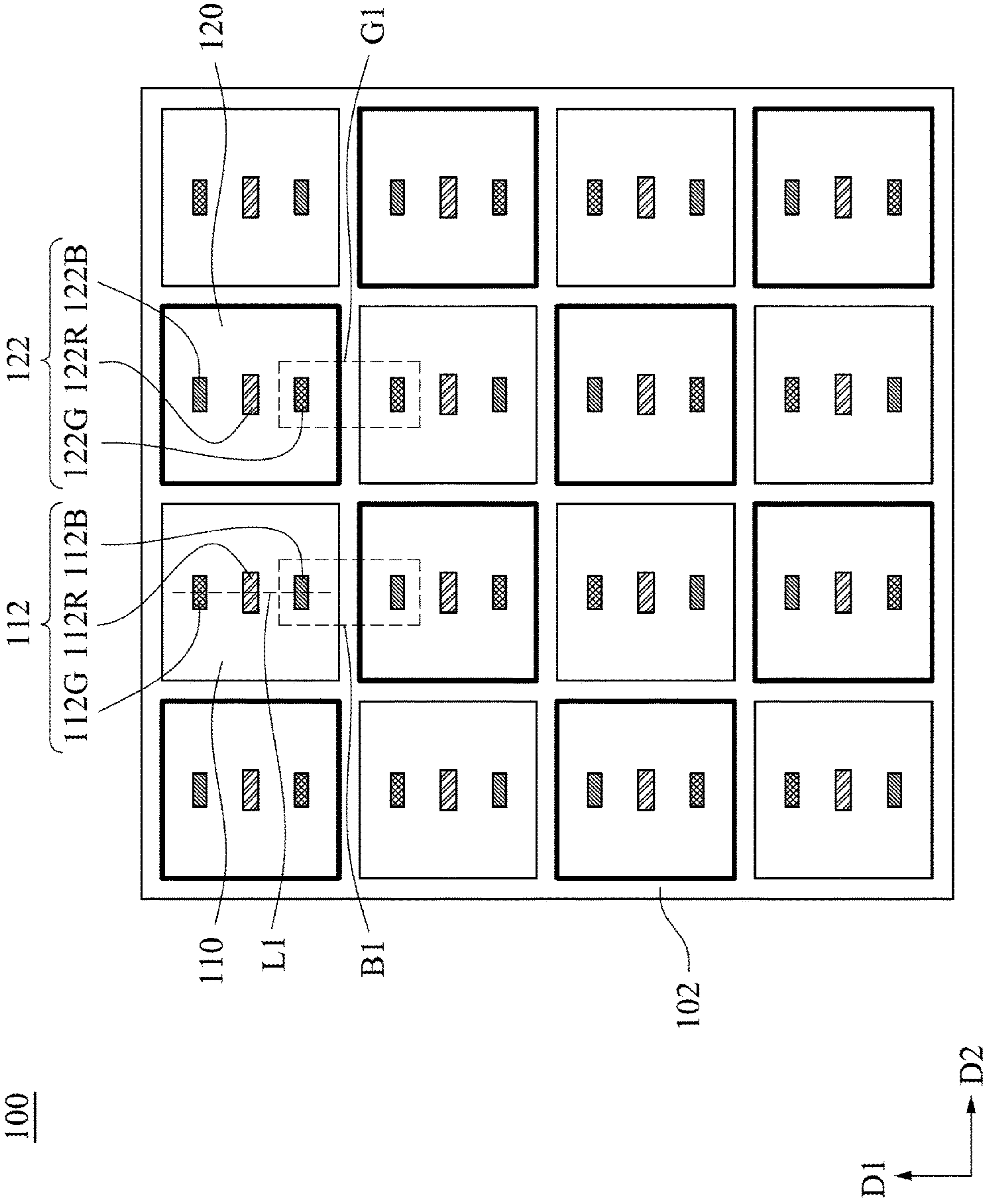
FIG. 1 illustrates a top view of a display device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Some embodiments of the present disclosure can improve mosaic or color difference issue of panels. Mosaic issue may result from significant wavelength difference or brightness difference of light-emitting diodes in a local range. Arranging light-emitting diodes with similar wavelength at adjacent locations may develop light mixing effect to reduce the wavelength difference or brightness difference between the light-emitting diodes in the local range. Therefore, mosaic issue of the panels can be solved and manufacturing costs can be reduced as well.

FIG. 1 illustrates a top view of a display device 100 according to some embodiments of the present disclosure. The display device 100 includes a carrier 102, a plurality of first packages 110 and a plurality of second packages 120. The carrier 102 may be a substrate including integrated circuits. In some embodiments, the carrier 102 may be made of any suitable material, such as BT resin, molded interconnect substrate (MIS), epoxy molding compound (EMC), sheet molding compound (SMC), FR-4, glass, polyimide, epoxy resin or the like.

A plurality of the first packages 110 and a plurality of the second packages 120 are on the carrier 102. The first packages 110 and the second packages 120 are alternately arranged along the first direction D1. Each of the first packages 110 includes a plurality of first light-emitting diode chips 112. The first light-emitting diode chips 112 includes a first green light-emitting diode chip 112G, a first red light-emitting diode chip 112R and a first blue light-emitting diode chip 112B able to emit green light, red light and blue light respectively. Each of the second packages 120 includes a plurality of second light-emitting diode chips 122. The second light-emitting diode chips 122 includes a second green light-emitting diode chip 122G, a second red light-emitting diode chip 122R and a second blue light-emitting diode chip 122B able to emit green light, red light and blue light respectively. For clarity, light-emitting diode chips emitting light with same color are represented by same screentones in FIG. 1. The edges of the second packages 120 in FIG. 1 are illustrated with thicker lines, and the edges of the first packages 110 in FIG. 1 are illustrated with thinner lines.

The arrangement of the first light-emitting diode chips 112 of the first packages 110 is different from the arrangement of the second light-emitting diode chips 122 of the second packages 120. The arrangement of the first light-emitting diode chips 112 in each of the first packages 110 are the same, and the arrangement of the second light-emitting diode chips 122 in each of the second packages 120 are the same. For example, as shown in FIG. 1, in each of the first light-emitting diode chips 112, the first blue light-emitting diode chip 112B, the first red light-emitting diode chip 112R and the first green light-emitting diode chip 112G are arranged along the first direction D1 in sequence, and the second green light-emitting diode chip 122G, the second red light-emitting diode chip 122R and the second blue light-emitting diode chip 122B are also arranged along the first direction D1 in sequence. That is, the sequence of arrangement of the first light-emitting diode chips 112 of the first packages 110 is opposite to the sequence of arrangement of the second light-emitting diode chips 122 of the second packages 120.

Moreover, in some embodiments, the first packages 110 and the second packages 120 are further alternately arranged along a second direction D2 different from the first direction D1, as shown in FIG. 1. For example, the first direction D1 and the second direction D2 are substantially perpendicular to each other. In some embodiments, the first light-emitting diode chips 112 of each of the first packages 110 may be arranged in a straight line to be aligned with each other. Therefore, a connecting line L1 of centers of the first green light-emitting diode chip 112G, the first red light-emitting diode chip 112R and the first blue light-emitting diode chip 112B is parallel to the first direction D1. The second light-emitting diode chips 122 of the second packages 120 may be aligned with the first light-emitting diode chips 112 of the first packages 110 in the first direction D1, as shown in FIG. 1.

When the arrangement of the first packages 110 and the second packages 120 are shown as FIG. 1, the first light-emitting diode chips 112 of the first packages 110 are adjacent to the second light-emitting diode chips 122 of the second packages 120 with similar wavelength. For example, the first green light-emitting diode chip 112G is adjacent to the second green light-emitting diode chip 122G (as shown by the light-emitting diode chips framed by the dashed line G1 in FIG. 1), and the first blue light-emitting diode chip 112B is adjacent to the second blue light-emitting diode chip 122B (as shown by the light-emitting diode chips framed by the dashed line B1 in FIG. 1).

Stated another way, the first red light-emitting diode chip 112R and the second red light-emitting diode chip 122R of the first package 110 and the second package 120 has a first pitch therebetween along the first direction D1, and the distance between the adjacent first green light-emitting diode chip 112G and second green light-emitting diode chip 122G is less than the first pitch, such as about one third of the first pitch. Similarly, the distance between the adjacent first blue light-emitting diode chip 112B and second blue light-emitting diode chip 122B is less than the first pitch, such as about one third of the first pitch.

Arranging light-emitting diode chips with similar wavelength at adjacent locations may achieve light mixing effect to reduce the color difference or brightness difference of the display device 100. The terms "similar wavelength" means that difference between the central wavelengths of two different light-emitting diode chips are within about 8 nm. The mosaic and color difference issue is improved by light mixing of the light-emitting diode chips with similar wavelength in the embodiments of the present disclosure. The specifications (for example, the central wavelength of the light-emitting diode chips) of the light-emitting diodes chips may be relaxed, thereby reducing the elimination rate of the light-emitting diode chips and reducing the manufacturing cost.

In some embodiments, the sizes of the first light-emitting diode chips 112 and the second light-emitting diode chips 122 may be adjusted based on actual conditions. For example, the size of the first red light-emitting diode chip 112R may larger than the sizes of the first green light-emitting diode chip 112G and the first blue light-emitting diode chip 112B, and the size of the second red light-emitting diode chip 122R may larger than the sizes of the second green light-emitting diode chip 122G and the second blue light-emitting diode chip 122B to make the illumination effect of different light-emitting diode chips consistent with each other.

Figure 2:
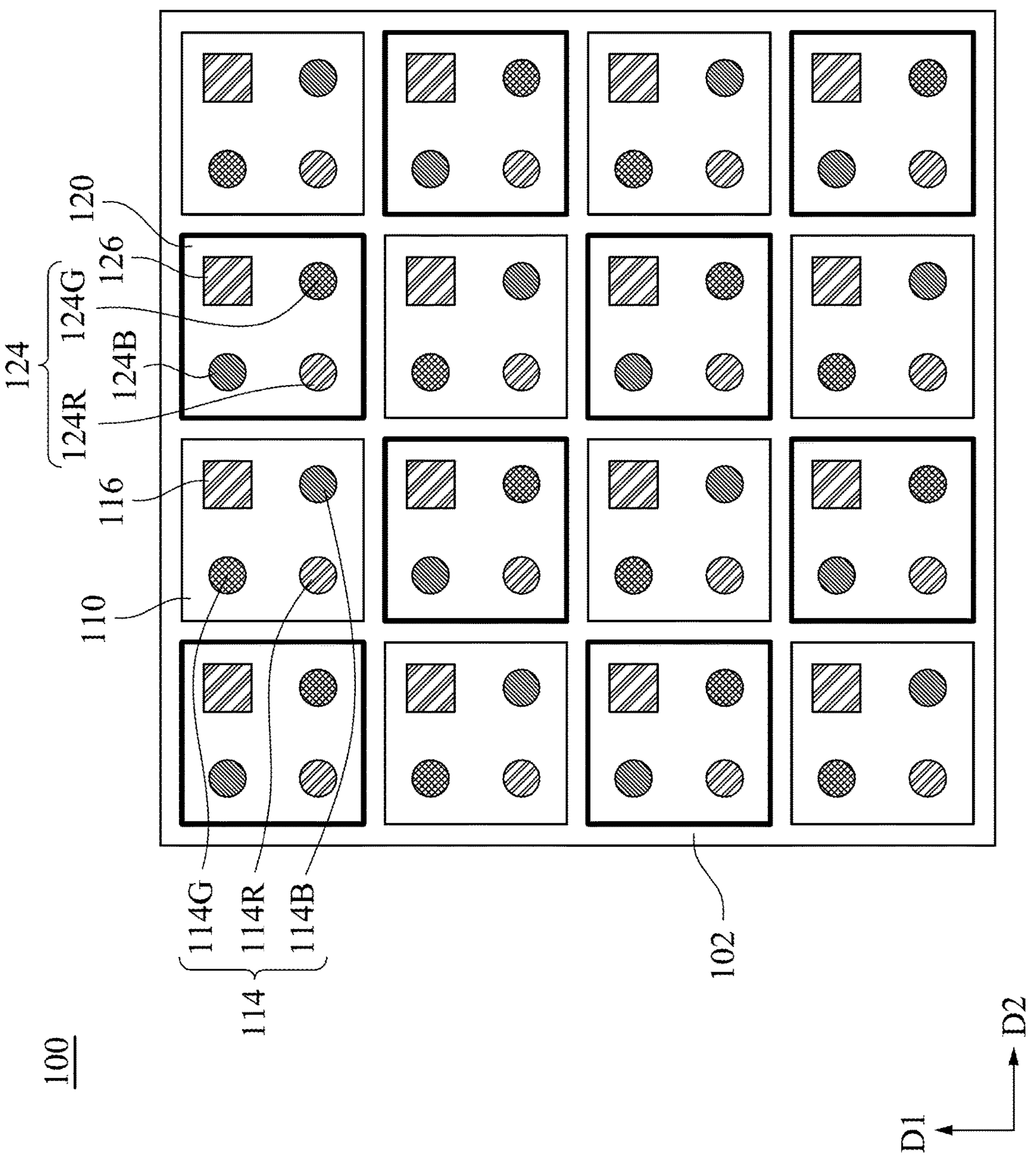
FIG. 2 illustrates a top view of electrodes of the display device in FIG. 1 according to some embodiments.

FIG. 2 illustrates a top view of electrodes of the display device 100 in FIG. 1 according to some embodiments. For clarity, FIG. 2 only illustrates locations of the electrodes of the display device 100 and the edges of each package, and the light-emitting diode chips of the display device 100 are omitted in FIG. 2. For example, each package further includes a wiring layer. The light-emitting diode chips are at the front side of the wiring layer, and the electrodes are at the backside of the wiring layer. The first packages 110 include a plurality of first electrodes 114 and a first common electrode 116. The first electrodes 114 include first electrodes 114R, 114G and 114B, and are respectively electrically connected to the first red light-emitting diode chip 112R, the first green light-emitting diode chip 112G and the first blue light-emitting diode chip 112B through the wiring layer. The second packages 120 include a plurality of second electrodes 124 and a second common electrode 126. The second electrodes 124 include second electrodes 124R, 124G and 124B, and are respectively electrically connected to the second red light-emitting diode chip 122R, the second green light-emitting diode chip 122G and the second blue light-emitting diode chip 122B through the wiring layer. For clarity, the electrodes (i.e. the first electrodes 114 and the second electrodes 124) connected to the light-emitting diode chips emitting light with same color are represented by same screentones in FIG. 2, and the common electrodes (i.e., the first common electrodes 116 and the second common electrodes 126) are also represented by same screentones. The edges of the second packages 120 in FIG. 2 are illustrated with thicker lines, and the edges of the first packages 110 in FIG. 2 are illustrated with thinner lines. Moreover, the first red light-emitting diode chip 112R, the first green light-emitting diode chip 112G and the first blue light-emitting diode chip 112B are all connected to the first common electrode 116, the second red light-emitting diode chip 122R, the second green light-emitting diode chip 122G and the second blue light-emitting diode chip 122B are all connected to the second common electrode 126.

The first electrodes 114 and the first common electrode 116 are opposite nodes. For example, when the first electrodes 114 are positive electrodes, the first common electrode 116 is a negative electrode, and vice versa. The second electrodes 124 and the second common electrode 126 are opposite nodes. For example, when the second electrodes 124 are positive electrodes, the second common electrode 126 is a negative electrode, and vice versa.

The first electrodes 114, the first common electrode 116, the second electrodes 124 and the second common electrode 126 may be arranged based on any suitable arrangement. For example, as shown in FIG. 2, the location of the first common electrodes 116 of the first packages 110 is the same as the location of the second common electrodes 126 of the second packages 120 (i.e., all at upper-right corner of the packages), but the arrangement of the first electrodes 114 of the first packages 110 are different from the arrangement of the second electrodes 124 of the second packages 120. For example, the first electrodes 114R of the first packages 110 and the second electrodes 124R of the second packages 120 are all at the bottom-left corner of the packages, the first electrodes 114G of the first packages 110 and the second electrodes 124B of the second packages 120 are all at the upper-left corner of the packages, and the first electrodes 114B of the first packages 110 and the second electrodes 124G of the second packages 120 are all at the bottom-right corner of the packages. In other words, the arrangement of the electrodes of the first packages 110 after rotating 180 degree is also different from the arrangement of the electrodes of the second packages 120. Such configuration is beneficial to simplify placement and routing of the electrodes. It is noted that the arrangement of the first electrodes 114, the first common electrodes 116, the second electrodes 124 and the second common electrodes 126 is not limited to the arrangement shown in FIG. 2, and a person having ordinary skill in the art can change the arrangement within the scope of the present disclosure.

Figure 3:
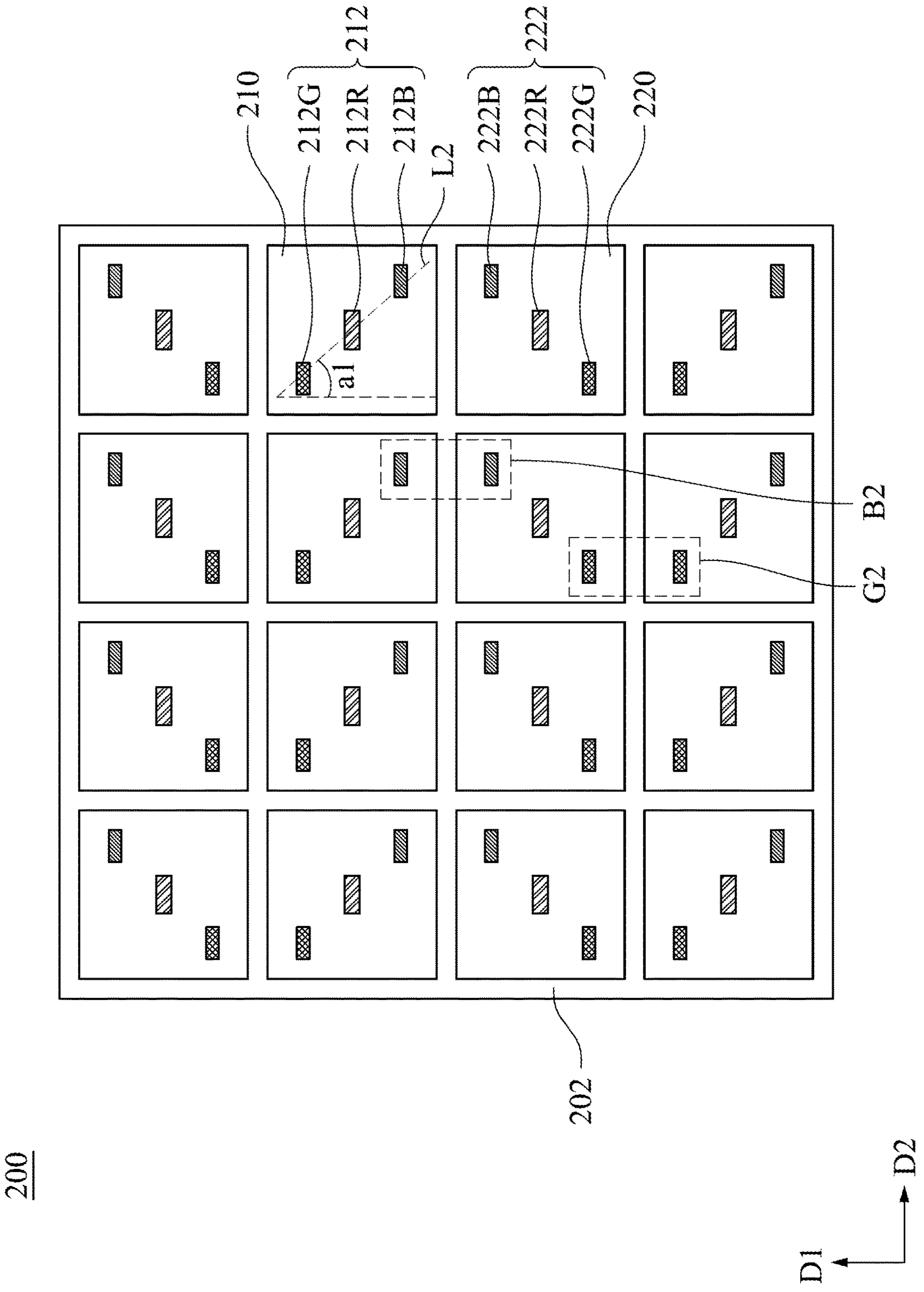
FIG. 3 illustrates a top view of a display device according to some embodiments of the present disclosure.

FIG. 3 illustrates a top view of a display device 200 according to some embodiments of the present disclosure. The display device 200 includes a carrier 202, a plurality of first packages 210 and a plurality of second packages 220. Each of the first packages 210 includes a plurality of first light-emitting diode chips 212. The first light-emitting diode chips 212 includes a first green light-emitting diode chip 212G, a first red light-emitting diode chip 212R and a first blue light-emitting diode chip 212B able to emit green light, red light and blue light respectively. Each of the second packages 220 includes a plurality of second light-emitting diode chips 222. The second light-emitting diode chips 222 includes a second green light-emitting diode chip 222G, a second red light-emitting diode chip 222R and a second blue light-emitting diode chip 222B able to emit green light, red light and blue light respectively. The carrier 202, the first light-emitting diode chips 212 of the first packages 210, the second light-emitting diode chips 222 of the second packages 220 are similar to or the same as the carrier 102, the first light-emitting diode chips 112 of the first packages 110, the second light-emitting diode chips 122 of the second packages 120 mentioned above; therefore detailed description are not described herein.

The difference between the FIG. 1 and FIG. 3 is the arrangement of the light-emitting diode chips in the packages and the arrangement of different packages on the carrier. In some embodiments, the first packages 110 and the second packages 120 of the display device 100 may be alternately arranged along the first direction D1 and the second direction D2 respectively, as shown in FIG. 1. On the other hands, the first packages 210 and the second packages 220 of the display device 200 may only be alternately arranged along the first direction D1, and the same packages (such as the first packages 210 or the second packages 220) are arranged along the second direction D2, as shown in FIG. 3. In other words, the first packages 210 are adjacent to each other in the second direction D2, and the second packages 220 are adjacent to each other in the second direction D2.

In some embodiments, the first light-emitting diode chips 212 and the second light-emitting diode chips 222 of the first packages 210 and the second packages 220 may be arranged in a slant line, as shown in FIG. 3. Therefore, a connecting line L2 of centers of the first green light-emitting diode chip 212G, the first red light-emitting diode chip 212R and the first blue light-emitting diode chip 212B of each of the first packages 210 and the first direction D1 forms an acute angle a1. In FIG. 3, the first blue light-emitting diode chip 212B, the first red light-emitting diode chip 212R and the first green light-emitting diode chip 212G are arranged along the first direction D1 in sequence, and the second green light-emitting diode chip 222G, the second red light-emitting diode chip 222R and the second blue light-emitting diode chip 222B are arranged along the first direction D1 in sequence. In addition, the first green light-emitting diode chip 212G and the first blue light-emitting diode chip 212B of each first package 210 are at the opposite corners of each first package 210, and the second green light-emitting diode chip 222G and the second blue light-emitting diode chip 222B of each second package 220 are at the opposite corners of each second package 220. The second blue light-emitting diode chip 222B is aligned with the first blue light-emitting diode chip 212B in the first direction D1, and the second green light-emitting diode chip 222G is aligned with the first green light-emitting diode chip 212G in the first direction D1. Therefore, the first blue light-emitting diode chip 212B is adjacent to the second blue light-emitting diode chip 222B (as shown by the light-emitting diode chips framed by the dashed line B2 in FIG. 3), and the first green light-emitting diode chip 212G is adjacent to the second green light-emitting diode chip 222G (as shown by the light-emitting diode chips framed by the dashed line G2 in FIG. 3). As such, the color difference and the brightness difference of the display device 200 decrease, thereby reducing the mosaic and color difference issue of the display device 200. The manufacturing cost of the display device 200 is also reduced.

Figure 4:
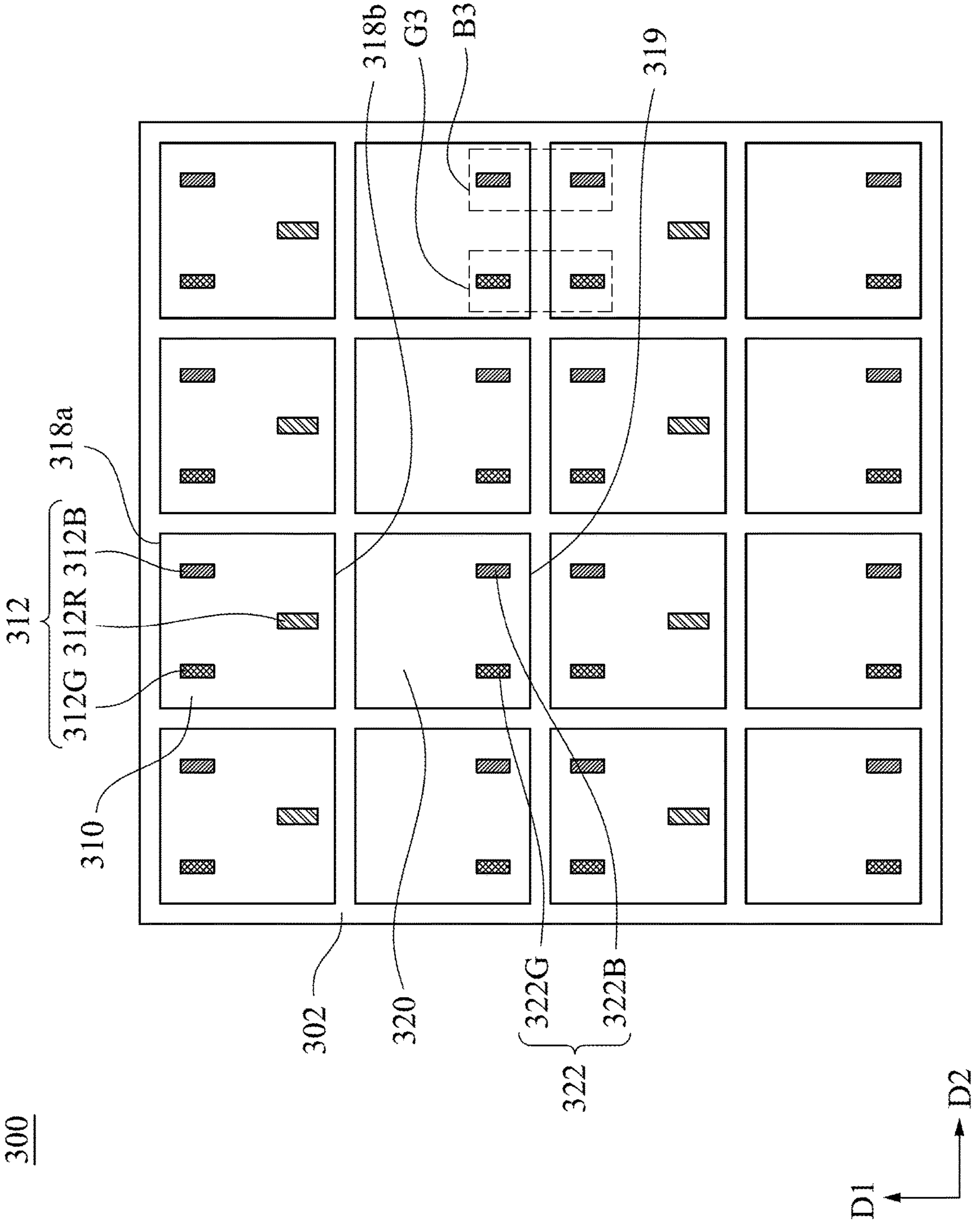
FIG. 4 illustrates a top view of a display device according to some embodiments of the present disclosure.

The number of the light-emitting diode chips in the packages may be adjusted based on different conditions, as shown in FIG. 4. FIG. 4 illustrates a top view of the display device 300 according to some embodiments of the present disclosure. The display device 300 includes a carrier 302, a plurality of first packages 310 and a plurality of second packages 320. The arrangement of the first packages 310 is different from the arrangement of the second packages 320. The arrangement of the first light-emitting diode chips 312 of each of the first packages 310 are the same, and the arrangement of the second light-emitting diode chips 322 of each of the second packages 320 are the same. In FIG. 4, a number of the first light-emitting diode chips 312 of each of the first packages 310 is greater than a number of the second light-emitting diode chips 322 of each of the second packages 320. For example, the first packages 310 may include a first red light-emitting diode chip 312R, a first green light-emitting diode chip 312G and a first blue light-emitting diode chip 312B, and the second packages 320 may only include a second green light-emitting diode chip 322G and a second blue light-emitting diode chip 322B. The carrier 302, the first light-emitting diode chips 312 of the first packages 310, the second green light-emitting diode chip 322G and the second blue light-emitting diode chip 322B of the second packages 320 are similar to or the same as the carrier 102, the first light-emitting diode chips 112 of the first packages 110, the second green light-emitting diode chip 122G and the second blue light-emitting diode chip 122B of the second packages 120 mentioned above; therefore detailed description are not described herein. For clarity, light-emitting diode chips emitting light with same color are represented by same screentones in FIG. 4.

The first packages 310 and the second packages 320 of the display device 300 are alternately arranged along the first direction D1, and the same packages (such as the first packages 310 or the second packages 320) are arranged along the second direction D2. The first green light-emitting diode chip 312G, the first red light-emitting diode chip 312R and the first blue light-emitting diode chip 312B are arranged along the second direction D2 in sequence, and the second green light-emitting diode chip 322G and the second blue light-emitting diode chip 322B are arranged along the second direction D2 in sequence. When the arrangement of the first packages 310 and the second packages 320 are shown as FIG. 4, the first light-emitting diode chips 312 of the first packages 310 are adjacent to the second light-emitting diode chips 322 of the second packages 320 with similar wavelength. For example, the first green light-emitting diode chip 312G is adjacent to the second green light-emitting diode chip 322G (as shown by the light-emitting diode chips framed by the dashed line G3 in FIG. 4) in the first direction D1, and the first blue light-emitting diode chip 312B is adjacent to the second blue light-emitting diode chip 322B (as shown by the light-emitting diode chips framed by the dashed line B3 in FIG. 4) in the first direction D1. Arranging light-emitting diode chips with similar wavelength at adjacent locations may develop light mixing effect to reduce the color difference or brightness difference of the display device 300. The manufacturing cost of the display device 300 is also reduced.

In some embodiments shown as FIG. 4, the first green light-emitting diode chip 312G and the first blue light-emitting diode chip 312B are at a first side 318*a* of the first package 310, and the first red light-emitting diode chip 312R is at a second side 318*b* opposite to the first side 318*a* of the first package 310. In particular, the first green light-emitting diode chip 312G and the first blue light-emitting diode chip 312B are at the corners of the first side 318*a* respectively, and the first red light-emitting diode chip 312R is near the middle point of the second side 318*b*. Moreover, the second green light-emitting diode chip 322G and the second blue light-emitting diode chip 322B are at the corners of the third side 319 respectively. Compared with the second side 318*b* of the first package 310, the third side 319 is closer to the first side 318*a*. Therefore, the first red light-emitting diode chip 312R of the first package 310 is in the middle of the first green light-emitting diode chip 312G, the first blue light-emitting diode chip 312B, the second green light-emitting diode chip 322G and the second blue light-emitting diode chip 322B. The size of the first red light-emitting diode chip 312R is larger than the first green light-emitting diode chip 312G, the first blue light-emitting diode chip 312B, the second green light-emitting diode chip 322G and the second blue light-emitting diode chip 322B, so such configuration may reduce usages of the light-emitting diode chips, thereby reducing the manufacturing cost of the display device 300.

Figure 5:
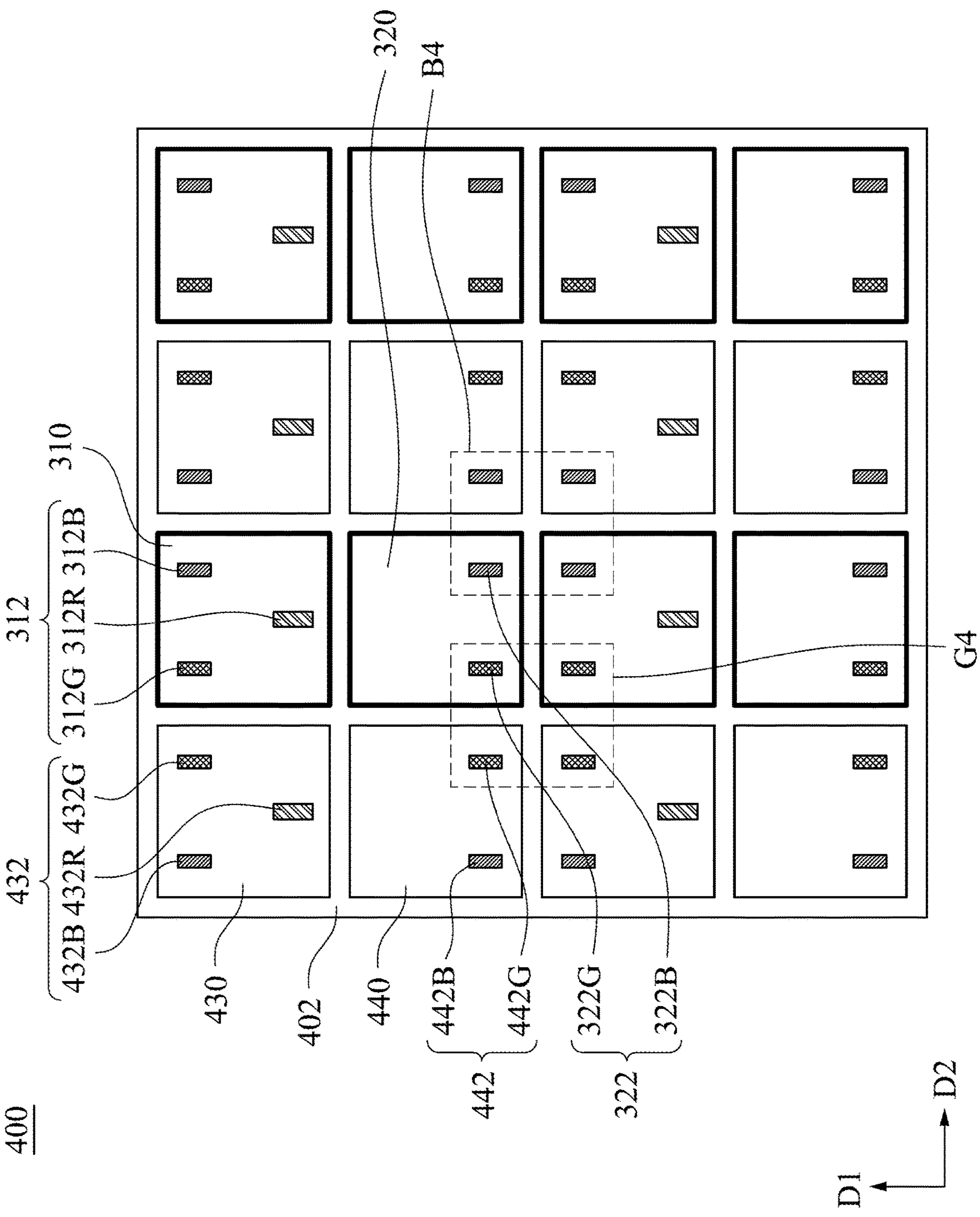
FIG. 5 illustrates a top view of a display device according to some embodiments of the present disclosure.

FIG. 5 illustrates a top view of a display device 400 according to some embodiments of the present disclosure. The display device 400 includes a plurality of the first packages 310 and the second packages 320 arranged on the carrier 402. The first packages 310 and the second packages 320 of the display device 400 are same as the first packages 310 and the second packages 320 in FIG. 4. The difference between the display device 400 and the display device 300 is that the display device 400 further includes a plurality of third packages 430 and fourth packages 440 arranged on the carrier 402. The third packages 430 include a plurality of third light-emitting diode chips 432, and the fourth packages 440 include a plurality of fourth light-emitting diode chips 442. The third light-emitting diode chips 432 include a third green light-emitting diode chip 432G, a third red light-emitting diode chip 432R and a third blue light-emitting diode chip 432B, and the fourth light-emitting diode chips 442 include a fourth green light-emitting diode chip 442G and a fourth blue light-emitting diode chip 442B. For clarity, light-emitting diode chips emitting light with same color are represented by same screentones in FIG. 5. The edges of the first packages 310 and second packages 320 in FIG. 5 are illustrated with thicker lines, and the edges of the third packages 430 and the fourth packages 440 in FIG. 5 are illustrated with thinner lines.

The first packages 310 and the third packages 430 of the display device 400 are alternately arranged along the second direction D2, and the arrangement of the first light-emitting diode chips 312 of the first packages 310 is different from the arrangement of the third light-emitting diode chips 432 of the third packages 430. The second packages 320 and the fourth packages 440 of the display device 400 are alternately arranged along the second direction D2, and the arrangement of the second light-emitting diode chips 322 of the second packages 320 is different from the arrangement of the fourth light-emitting diode chips 442 of the fourth packages 440.

The arrangement of the third light-emitting diode chips 432 in each of the third packages 430 are the same, and the arrangement of the fourth light-emitting diode chips 442 in each of the fourth packages 440 are the same. In particular, the third blue light-emitting diode chip 432B, the third red light-emitting diode chip 432R and the third green light-emitting diode chip 432G are arranged along the second direction D2 in sequence. The third green light-emitting diode chip 432G and the third blue light-emitting diode chip 432B are aligned with the first green light-emitting diode chip 312G and the first blue light-emitting diode chip 312B along the second direction D2 and are not aligned with the first red light-emitting diode chip 312R along the second direction D2. The third red light-emitting diode chip 432R is aligned with the first red light-emitting diode chip 312R along the second direction D2. The fourth blue light-emitting diode chip 442B and the fourth green light-emitting diode chip 442G are arranged along the second direction D2 in sequence. The fourth green light-emitting diode chip 442G and the fourth blue light-emitting diode chip 442B are aligned with the second green light-emitting diode chip 322G and the second blue light-emitting diode chip 322B along the second direction D2. As such, the third red light-emitting diode chip 432R of the third package 430 is in the middle of the third green light-emitting diode chip 432G, the third blue light-emitting diode chip 432B, the fourth green light-emitting diode chip 442G and the fourth blue light-emitting diode chip 442B. The size of the third red light-emitting diode chip 432R is larger than the third green light-emitting diode chip 432G, the third blue light-emitting diode chip 432B, the fourth green light-emitting diode chip 442G and the fourth blue light-emitting diode chip 442B, so such configuration may reduce usages of the light-emitting diode chips, thereby reducing the manufacturing cost of the display device 400.

As shown in FIG. 4 and FIG. 5, during a display operation, according to a display information, the first package 310 forms a pixel, and the first red light-emitting diode chip 312R of the first package 310 is configured to cooperate with the second blue light-emitting diode chip 322B and the second green light-emitting diode chip 322G of the adjacent second package 320 to form another pixel. That is, the adjacent first package 310 and the second package 320 may share the first red light-emitting diode chip 312R to reduce the number of the light-emitting diode chips in the display device 300.

Similarly, in FIG. 5, during the display operation, according to a display information, the third package 430 forms a pixel, and the third red light-emitting diode chip 432R of the third package 430 is configured to cooperate with the fourth blue light-emitting diode chip 442B and the fourth green light-emitting diode chip 442G of the adjacent second package 440 to form another pixel. That is, the adjacent third package 430 and the fourth package 440 may share the third red light-emitting diode chip 432R to reduce the number of the light-emitting diode chips in the display device 400.

When the arrangement of the first packages 310, the second packages 320, the third packages 430 and the fourth packages 440 are shown as FIG. 5, the first light-emitting diode chips 312, the second light-emitting diode chips 322, the third light-emitting diode chips 432 and the fourth light-emitting diode chips 442 with similar wavelength are adjacent. For example, the first green light-emitting diode chip 312G and the second green light-emitting diode chip 322G, the first blue light-emitting diode chip 312B and the second blue light-emitting diode chip 322B, the third green light-emitting diode chip 432G and the fourth green light-emitting diode chip 442G, the third blue light-emitting diode chip 432B and the fourth blue light-emitting diode chip 442B are adjacent along the first direction D1. The first green light-emitting diode chip 312G and the third green light-emitting diode chips 432G, the first blue light-emitting diode chips 312B and the third blue light-emitting diode chips 432B, the second green light-emitting diode chip 322G and the fourth green light-emitting diode chip 442G, the second blue light-emitting diode chips 322B and the fourth blue light-emitting diode chips 442B are adjacent along the second direction D2. As such, four light-emitting diode chips with similar wavelength gather together (as shown by the light-emitting diode chips framed by the dashed line G4, B4 in FIG. 5). Arranging light-emitting diode chips with similar wavelength at adjacent locations may develop light mixing effect to reduce the color difference or brightness difference of the display device 400. The manufacturing cost of the display device 400 is also reduced.

Figure 6:
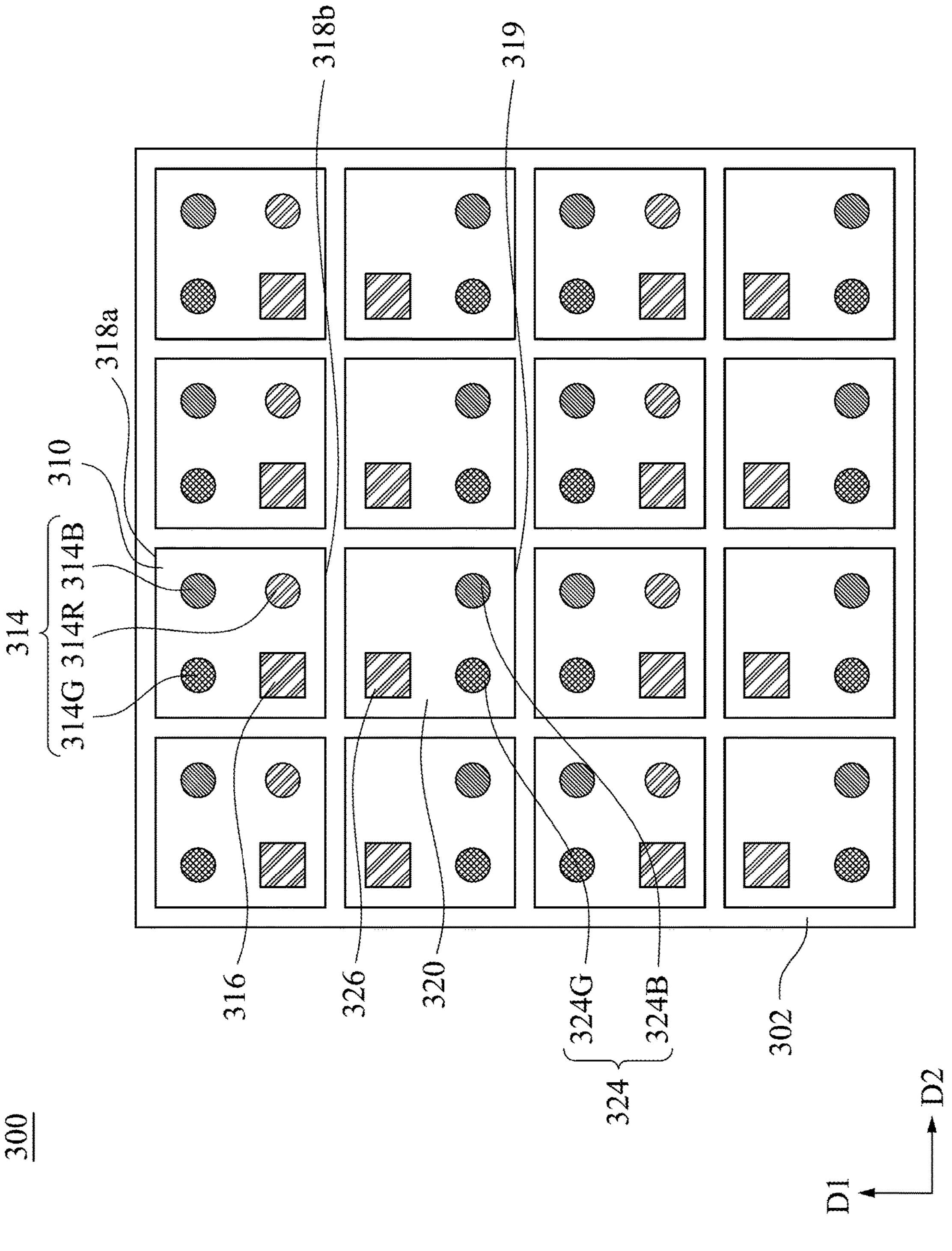
FIG. 6 illustrates a top view of electrodes of the display device in FIG. 4 according to some embodiments.

FIG. 6 illustrates a top view of electrodes of the display device 300 in FIG. 4 according to some embodiments. For clarity, FIG. 6 only illustrates locations of the electrodes of the display device 300 and the edges of each package, and the light-emitting diode chips of the display device 300 are omitted in FIG. 6. For example, each package further includes a wiring layer. The light-emitting diode chips are at the front side of the wiring layer, and the electrodes are at the backside of the wiring layer. The first packages 310 include a plurality of first electrodes 314 and a first common electrode 316. The first electrodes 314 include first electrodes 314R, 314G and 134B, and are respectively electrically connected to the first red light-emitting diode chip 312R, the first green light-emitting diode chip 312G and the first blue light-emitting diode chip 312B through the wiring layer. The second packages 320 include a plurality of second electrodes 324 and a second common electrode 326. The second electrodes 324 include second electrodes 324G and 324B, and are respectively electrically connected to the second green light-emitting diode chip 322G and the second blue light-emitting diode chip 322B through the wiring layer. For clarity, the electrodes (i.e. the first electrodes 314 and the second electrodes 324) connected to the light-emitting diode chips emitting light with same color are represented by same screentones in FIG. 6, and the common electrodes (i.e., the first common electrodes 316 and the second common electrodes 326) are also represented by same screentones. Moreover, the first red light-emitting diode chip 312R, the first green light-emitting diode chip 312G and the first blue light-emitting diode chip 312B are all connected to the first common electrode 316, the second green light-emitting diode chip 322G and the second blue light-emitting diode chip 322B are all connected to the second common electrode 326.

The first electrodes 314 and the first common electrode 316 are opposite nodes. For example, when the first electrodes 314 are positive electrodes, the first common electrode 316 is a negative electrode, and vice versa. The second electrodes 324 and the second common electrode 326 are opposite nodes. For example, when the second electrodes 324 are positive electrodes, the second common electrode 326 is a negative electrode, and vice versa.

The first green light-emitting diode chip 312G and the first blue light-emitting diode chip 312B are at the first side 318*a* of the first package 310, the second green light-emitting diode chip 322G and the second blue light-emitting diode chip 322B are at the third side 319 of the second package 320. Therefore, the first electrodes 314G and 314B are at the first side 318*a* of the first package 310, and the second electrodes 324G and 324B are at the third side 319 of the second package 320. However, the arrangement of the first electrodes 314, the first common electrode 316, the second electrodes 324 and the second common electrode 326 of the display device 300 are not limited to the arrangement shown in FIG. 6, and can be arranged in any suitable arrangement.

Figure 7:
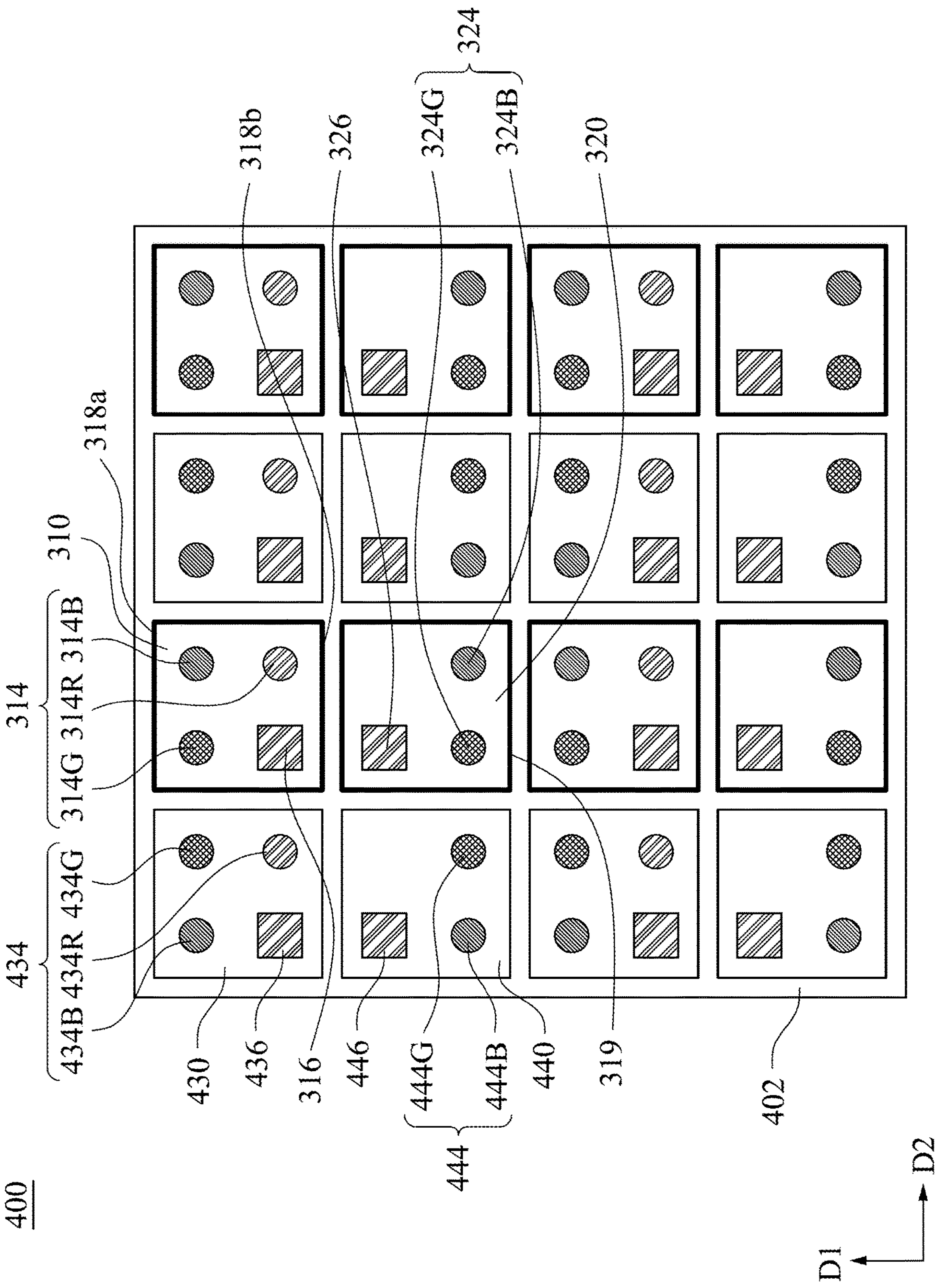
FIG. 7 illustrates a top view of electrodes of the display device in FIG. 5 according to some embodiments.

FIG. 7 illustrates a top view of electrodes of the display device 400 in FIG. 5 according to some embodiments. For clarity, FIG. 7 only illustrates locations of the electrodes of the display device 400 and the edges of each package, and the light-emitting diode chips of the display device 400 are omitted in FIG. 7. For example, each package further includes a wiring layer. The light-emitting diode chips are at the front side of the wiring layer, and the electrodes are at the backside of the wiring layer. The arrangement of the first electrodes 314, the first common electrode 316, the second electrodes 324 and the second common electrode 326 are same as the arrangement shown in FIG. 6. Moreover, the third packages 430 of the display device 400 include a plurality of third electrodes 434 and a third common electrode 436. The third electrodes 434 include third electrodes 434R, 434G and 434B, and are respectively electrically connected to the third red light-emitting diode chip 432R, the third green light-emitting diode chip 432G and the third blue light-emitting diode chip 432B through the wiring layer. The fourth packages 440 include a plurality of fourth electrodes 444 and a fourth common electrode 446. The fourth electrodes 444 include fourth electrodes 444G and 444B, and are respectively electrically connected to the fourth green light-emitting diode chip 442G and the fourth blue light-emitting diode chip 442B through the wiring layer. For clarity, the electrodes (i.e. the third electrodes 434 and the fourth electrodes 444) connected to the light-emitting diode chips emitting light with same color are represented by same screentones in FIG. 7, and the common electrodes (i.e. the third common electrodes 436 and the fourth common electrodes 446) are also represented by same screentones. The edges of the first packages 310 and the second packages 320 in FIG. 7 are illustrated with thicker lines, and the edges of the third packages 430 and the fourth packages 440 in FIG. 7 are illustrated with thinner lines. Moreover, the third red light-emitting diode chip 432R, the third green light-emitting diode chip 432G and the third blue light-emitting diode chip 432B are all connected to the third common electrode 436, and the fourth green light-emitting diode chip 442G and the fourth blue light-emitting diode chip 442B are all connected to the fourth common electrode 446.

The third electrodes 434 and the third common electrode 436 are opposite nodes. For example, when the third electrodes 434 are positive electrodes, the third common electrode 436 is a negative electrode, and vice versa. The fourth electrodes 444 and the fourth common electrode 446 are opposite nodes. For example, when the fourth electrodes 444 are positive electrodes, the fourth common electrode 446 is a negative electrode, and vice versa.

The third electrodes 434G and 434B may be aligned with the first electrodes 314G and 314B along the second direction D2, and the third electrode 434R and the third common electrode 436 may be aligned with the first electrode 314R and the first common electrode 316 along the second direction D2. The fourth electrodes 444G and 444B may be aligned with the second electrodes 324G and 324B along the second direction D2, and the fourth common electrode 446 may be aligned with the second common electrode 326 along the second direction D2. However, the arrangement of the first electrodes 314, the first common electrode 316, the second electrodes 324, the second common electrode 326, the third electrodes 434, the third common electrode 436, the fourth electrodes 444, the fourth common electrode 446 of the display device 400 are not limited to the arrangement shown in FIG. 7, and can be arranged in any suitable arrangement.

Figure 8:
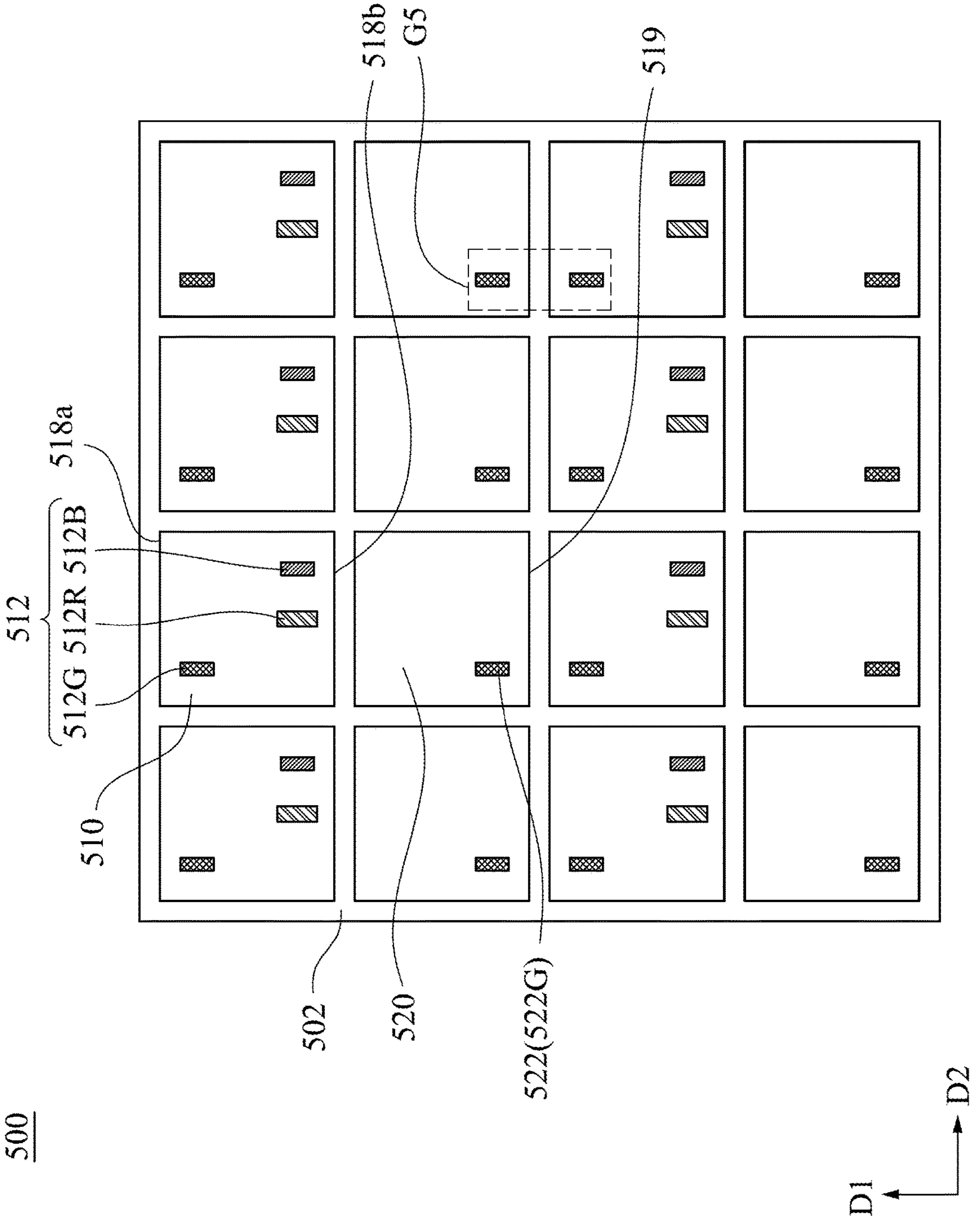
FIG. 8 illustrates a top view of a display device according to some embodiments of the present disclosure.

FIG. 8 illustrates a top view of the display device 500 according to some embodiments of the present disclosure. The display device 500 includes a carrier 502, a plurality of first packages 510 and a plurality of second packages 520. The arrangement of the first packages 510 is different from the arrangement of the second packages 520. The arrangement of the first light-emitting diode chips 512 of each of the first packages 510 are the same, and the arrangement of the second light-emitting diode chips 522 of each of the second packages 520 are the same. In the display device 500, the first packages 510 may include a first red light-emitting diode chip 512R, a first green light-emitting diode chip 512G, and a first blue light-emitting diode chip 512B, and the second packages 520 may only include a second green light-emitting diode chip 522G. The size of the first red light-emitting diode chip 512R may be larger than the first green light-emitting diode chip 512G, the first blue light-emitting diode chip 512B and the second green light-emitting diode chip 522G. The carrier 502, the first light-emitting diode chips 512 of the first packages 510, the second green light-emitting diode chip 522G of the second packages 520 are similar to or the same as the carrier 102, the first light-emitting diode chips 112 of the first packages 110, the second green light-emitting diode chip 122G of the second packages 120 mentioned above, therefore detailed description are not described herein. For clarity, light-emitting diode chips emitting light with same color are represented by same screentones in FIG. 8.

The first packages 510 and the second packages 520 of the display device 500 are alternately arranged along the first direction D1, and the same packages (such as the first packages 510 or the second packages 520) are arranged along the second direction D2. The first green light-emitting diode chip 512G, the first red light-emitting diode chip 512R and the first blue light-emitting diode chip 512B are arranged along the second direction D2 in sequence. When the arrangement of the first packages 510 and the second packages 520 are shown as FIG. 8, the first light-emitting diode chips 512 of the first packages 510 are adjacent to the second light-emitting diode chips 522 of the second packages 520 with similar wavelength. For example, the first green light-emitting diode chip 512G is adjacent to the second green light-emitting diode chip 522G (as shown by the light-emitting diode chips framed by the dashed line G5 in FIG. 8) in first direction D1. Arranging light-emitting diode chips with similar wavelength at adjacent locations may develop light mixing effect to reduce the color difference or brightness difference of the display device 500. The manufacturing cost of the display device 500 is also reduced.

In some embodiments shown as FIG. 8, the first green light-emitting diode chip 312G is at a first side 518*a* of the first package 510, and the first red light-emitting diode chip 512R and the first blue light-emitting diode chip 512B is at a second side 518*b* opposite to the first side 518*a* of the first package 510. In particular, the first green light-emitting diode chip 512G is at the corner of the first side 518*a*, the first red light-emitting diode chip 512R is near the middle point of the second side 518*b*, and the first blue light-emitting diode chip 512B is at the corner of the second side 518*b*. The first green light-emitting diode chip 512G and the first blue light-emitting diode chip 512B are at diagonal corners. Moreover, the second green light-emitting diode chip 522G is at the corner of the third side 519. Compared with the second side 518*b* of the first package 510, the third side 519 is closer to the first side 518*a*. Therefore, during display operation, according to a display information, the first package 510 forms a pixel, and the first red light-emitting diode chip 512R and the first blue light-emitting diode chip 512B of the first package 510 is configured to cooperate with the second green light-emitting diode chip 522G of the adjacent second package 520 to form another pixel. That is, the adjacent first package 510 and the second package 520 may share the first red light-emitting diode chip 512R and the first blue light-emitting diode chip 512B to reduce the number of the light-emitting diode chips in the display device 500.

Figure 9:
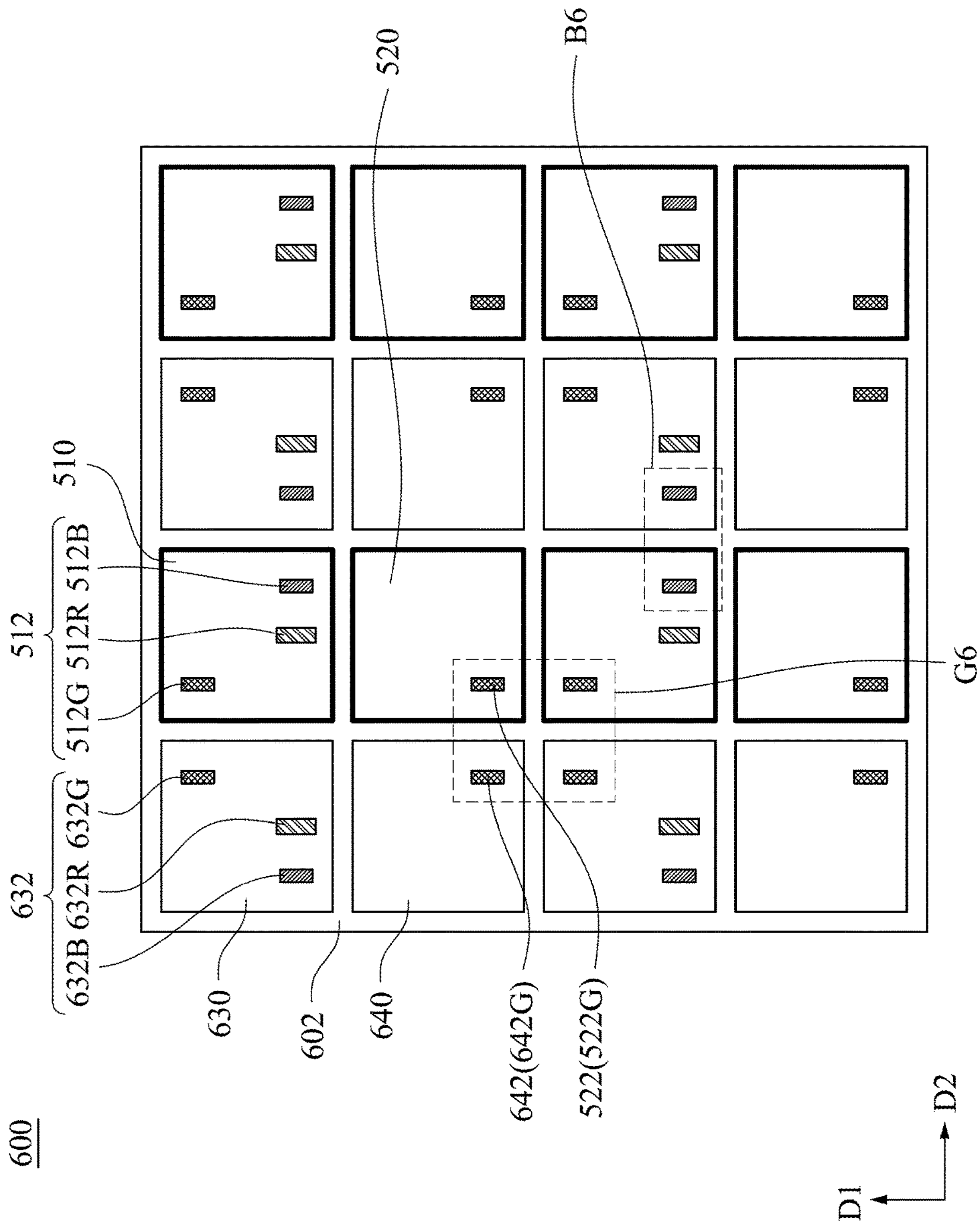
FIG. 9 illustrates a top view of a display device according to some embodiments of the present disclosure.

FIG. 9 illustrates a top view of a display device 600 according to some embodiments of the present disclosure. The display device 600 includes a plurality of the first packages 510 and the second packages 520 arranged on the carrier 602. The first packages 510 and the second packages 520 of the display device 600 are same as the first packages 510 and the second packages 520 in FIG. 8. The difference between the display device 600 and the display device 500 is that the display device 600 further includes a plurality of third packages 630 and fourth packages 640 arranged on the carrier 602. The third packages 630 include a plurality of third light-emitting diode chips 632, and the fourth packages 640 include a plurality of fourth light-emitting diode chips 642. The third light-emitting diode chips 632 include a third green light-emitting diode chip 632G, a third red light-emitting diode chip 632R and a third blue light-emitting diode chip 632B, and the fourth light-emitting diode chips 642 include a fourth green light-emitting diode chip 642G. The size of the third red light-emitting diode chip 632R may be larger than the third green light-emitting diode chip 632G, the third blue light-emitting diode chip 632B and the fourth green light-emitting diode chip 642G. For clarity, light-emitting diode chips emitting light with same color are represented by same screentones in FIG. 9. The edges of the first packages 510 and second packages 520 in FIG. 9 are illustrated with thicker lines, and the edges of the third packages 630 and the fourth packages 640 in FIG. 9 are illustrated with thinner lines.

The first packages 510 and the third packages 630 of the display device 600 are alternately arranged along the second direction D2, and the arrangement of the first light-emitting diode chips 512 of the first packages 510 is different from the arrangement of the third light-emitting diode chips 632 of the third packages 630. The second packages 520 and the fourth packages 640 of the display device 600 are alternately arranged along the second direction D2, and the arrangement of the second light-emitting diode chips 522 of the second packages 520 is different from the arrangement of the fourth light-emitting diode chips 642 of the fourth packages 640. The arrangement of the third light-emitting diode chips 632 in each of the third packages 630 are the same, and the arrangement of the fourth light-emitting diode chips 642 in each of the fourth packages 640 are the same. In particular, the third blue light-emitting diode chip 632B, the third red light-emitting diode chip 632R and the third green light-emitting diode chip 632G are arranged along the second direction D2 in sequence. The third green light-emitting diode chip 632G is aligned with the first green light-emitting diode chip 512G along the second direction D2 and are not aligned with the first red light-emitting diode chip 512R and the first blue light-emitting diode chip 512B along the second direction D2. The third red light-emitting diode chip 632R and the third blue light-emitting diode chip 632B are aligned with the first red light-emitting diode chip 512R and the first blue light-emitting diode chip 512B along the second direction D2. As such, during display operation, according to a display information, the third package 630 forms a pixel, and the third red light-emitting diode chip 632R and the third blue light-emitting diode chip 632B of the third package 630 is configured to with cooperate the fourth green light-emitting diode chip 642G of the adjacent fourth package 640 to form another pixel. That is, the adjacent third package 630 and the fourth package 640 may share the third red light-emitting diode chip 632R and the third blue light-emitting diode chip 632B to reduce the number of the light-emitting diode chips in the display device 600.

When the arrangement of the first packages 510, the second packages 520, the third packages 630 and the fourth packages 640 are shown as FIG. 9, the first light-emitting diode chips 512, the second light-emitting diode chips 522, the third light-emitting diode chips 632 and the fourth light-emitting diode chips 642 with similar wavelength are adjacent. For example, the first green light-emitting diode chip 512G and the second green light-emitting diode chip 522G, the third green light-emitting diode chip 632G and the fourth green light-emitting diode chip 642G are adjacent along the first direction D1. The first green light-emitting diode chip 512G and the third green light-emitting diode chips 632G, the first blue light-emitting diode chips 512B and the third blue light-emitting diode chips 632B, the second green light-emitting diode chip 522G and the fourth green light-emitting diode chip 642G are adjacent along the second direction D2. As such, the light-emitting diode chips with similar wavelength gather together (as shown by the light-emitting diode chips framed by the dashed line G6, B6 in FIG. 9). Arranging light-emitting diode chips with similar wavelength at adjacent locations may develop light mixing effect to reduce the color difference or brightness difference of the display device 600. The manufacturing cost of the display device 600 is also reduced.

Figure 10:
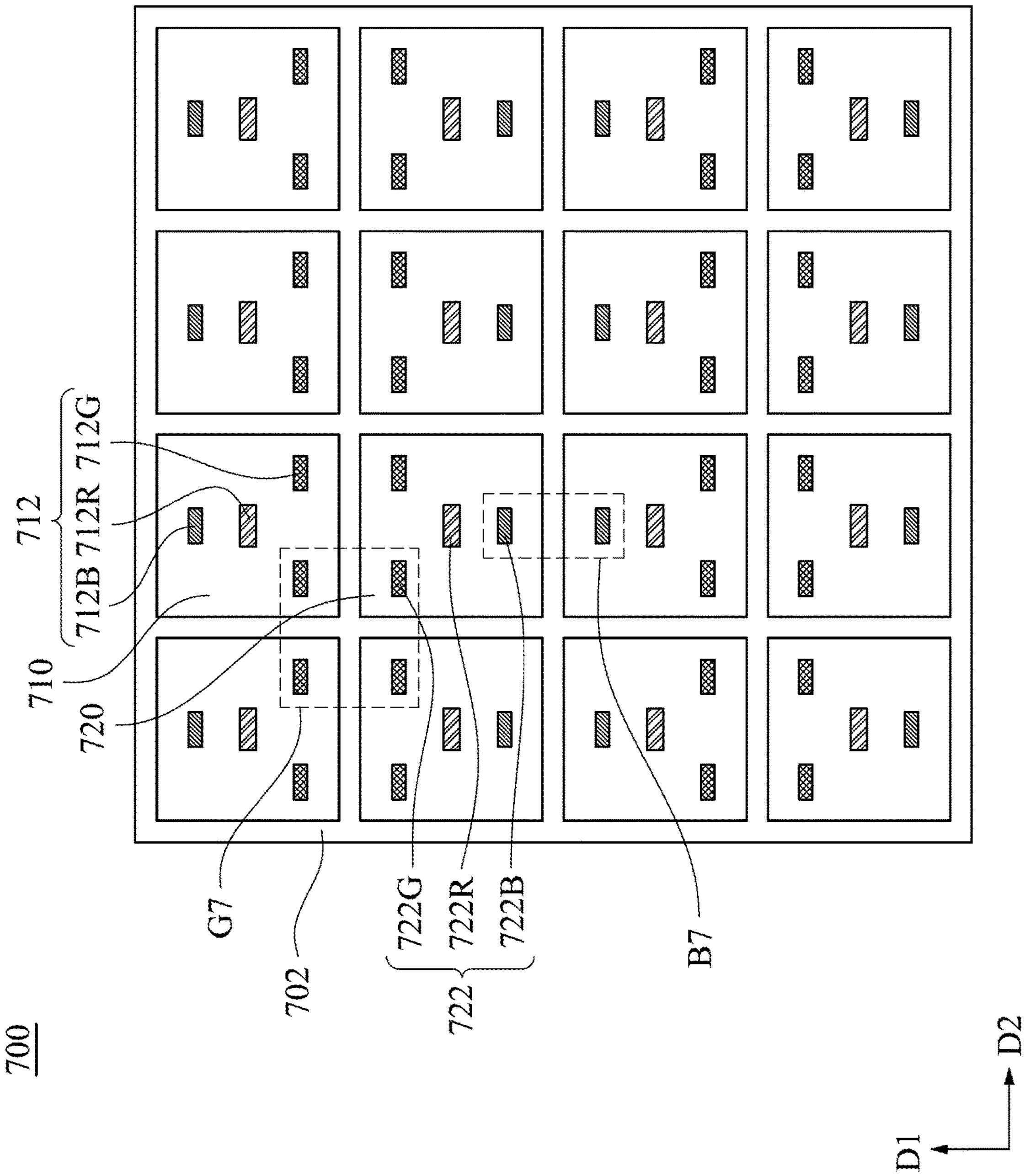
FIG. 10 illustrates a top view of a display device according to some embodiments of the present disclosure.

FIG. 10 illustrates a top view of the display device 700 according to some embodiments of the present disclosure. The display device 700 includes a carrier 702, a plurality of first packages 710 and a plurality of second packages 720. The arrangement of the first packages 710 is different from the arrangement of the second packages 720. The arrangement of the first light-emitting diode chips 712 of each of the first packages 710 are the same, and the arrangement of the second light-emitting diode chips 722 of each of the second packages 720 are the same. In the display device 700, the first packages 710 may include a first red light-emitting diode chip 712R, first green light-emitting diode chips 712G, and a first blue light-emitting diode chip 712B, and the second packages 720 may include a second red light-emitting diode chip 722R, second green light-emitting diode chips 722G, and a second blue light-emitting diode chip 722B. In the embodiments of FIG. 10, a number of one kind of the light-emitting diode chips may be more than another kind of the light-emitting diode chips. For example, the number of the first green light-emitting diode chips 712G may be 2, and the number of the first red light-emitting diode chip 712R and the number of the first blue light-emitting diode chip 712B may be 1 respectively. The number of the second green light-emitting diode chips 722G may be 2, and the number of the second red light-emitting diode chip 722R and the number of the second blue light-emitting diode chip 722B may be 1 respectively. The size of the first red light-emitting diode chip 712R and the second red light-emitting diode chip 722R may be larger than the first green light-emitting diode chips 712G, the first blue light-emitting diode chip 712B, the second green light-emitting diode chips 722G and the second blue light-emitting diode chip 722B. The carrier 702, the first light-emitting diode chips 712 of the first packages 710, the second light-emitting diode chips 722 of the second packages 720 are similar to or the same as the carrier 102, the first light-emitting diode chips 112 of the first packages 110, the second light-emitting diode chip 722 of the second packages 720 mentioned above; therefore detailed description are not described herein. For clarity, light-emitting diode chips emitting light with same color are represented by same screentones in FIG. 10.

The first packages 710 and the second packages 720 of the display device 700 are alternately arranged along the first direction D1, and the same packages (such as the first packages 710 or the second packages 720) are arranged along the second direction D2. Any of the first green light-emitting diode chips 712G, the first red light-emitting diode chip 712R and the first blue light-emitting diode chip 712B are arranged along the first direction D1 in sequence, and two first green light-emitting diode chips 712G are aligned with each other in the second direction D2. The second blue light-emitting diode chip 722B, the second red light-emitting diode chip 722R and any of the second green light-emitting diode chips 722G are arranged along the first direction D1 in sequence, and two second green light-emitting diode chips 722G are aligned with each other in the second direction D2. That is, the sequence of arrangement of the first light-emitting diode chips 712 of the first packages 710 is opposite to the sequence of arrangement of the second light-emitting diode chips 722 of the second packages 720. When the arrangement of the first packages 710 and the second packages 720 are shown as FIG. 10, the first light-emitting diode chips 712 of the first packages 710 are adjacent to the second light-emitting diode chips 722 of the second packages 720 with similar wavelength. For example, the first green light-emitting diode chip 712G is adjacent to the second green light-emitting diode chips 722G (as shown by the light-emitting diode chips framed by the dashed line G7 in FIG. 10) in the first direction D1 and the first direction D2 respectively. The first blue light-emitting diode chip 712B is adjacent to the second blue light-emitting diode chips 722B (as shown by the light-emitting diode chips framed by the dashed line B7 in FIG. 10) in the first direction D1. Arranging light-emitting diode chips with similar wavelength at adjacent locations may develop light mixing effect to reduce the color difference or brightness difference of the display device 700. The manufacturing cost of the display device 700 is also reduced.

Figure 11:
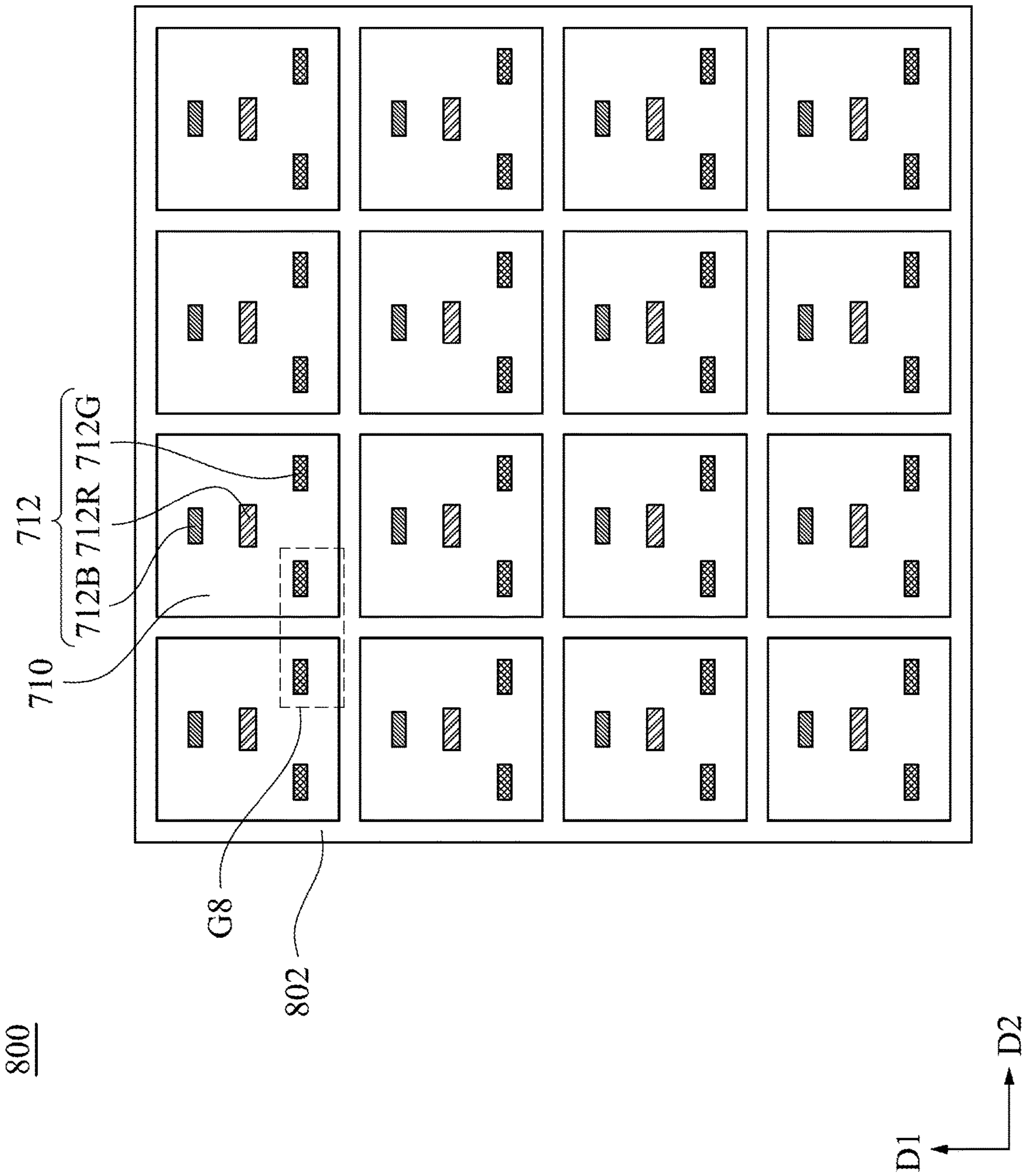
FIG. 11 illustrates a top view of a display device according to some embodiments of the present disclosure.

FIG. 11 illustrates a top view of the display device 800 according to some embodiments of the present disclosure. The display device 800 includes a carrier 802 and a plurality of the first packages 710. The carrier 802 and the first packages 710 of the display device 800 are same as the carrier 702 and the first packages 710 of the display device 700. The difference between the display device 700 and the display device 800 is that the second packages 720 of the display device 700 are replaced by the first packages 710 to form the display device 800. For clarity, light-emitting diode chips emitting light with same color are represented by same screentones in FIG. 11.

When the arrangement of the first packages 710 is shown as FIG. 11, the first light-emitting diode chips of the first packages 710 with similar wavelength are adjacent to each other. For example, the first green light-emitting diode chips 712G are adjacent to each other (as shown by the light-emitting diode chips framed by the dashed line G8 in FIG. 11) in the second direction D2. Arranging light-emitting diode chips with similar wavelength at adjacent locations may develop light mixing effect to reduce the color difference or brightness difference of the display device 800. The manufacturing cost of the display device 800 is also reduced.

Figure 12:
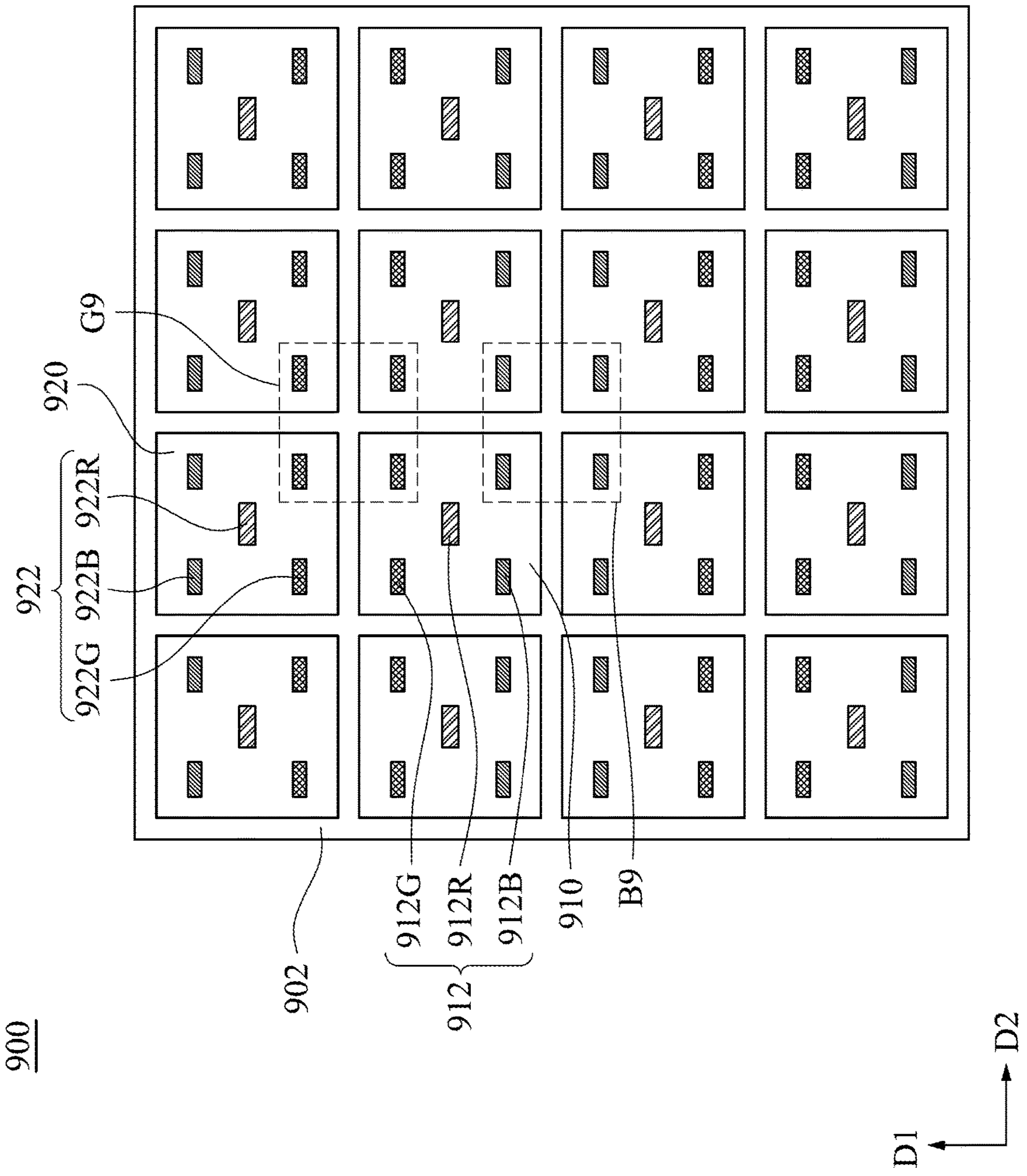
FIG. 12 illustrates a top view of a display device according to some embodiments of the present disclosure.

FIG. 12 illustrates a top view of the display device 900 according to some embodiments of the present disclosure. The display device 900 includes a carrier 902, a plurality of first packages 910 and a plurality of second packages 920. The arrangement of the first packages 910 is different from the arrangement of the second packages 920. The arrangement of the first light-emitting diode chips 912 of each of the first packages 910 are the same, and the arrangement of the second light-emitting diode chips 922 of each of the second packages 920 are the same. The embodiments of FIG. 12 may be similar to the embodiments of FIG. 10. In the display device 900, the first packages 910 may include a first red light-emitting diode chip 912R, first green light-emitting diode chips 912G, and first blue light-emitting diode chips 912B, and the second packages 720 may include a second red light-emitting diode chip 922R, second green light-emitting diode chips 922G, and second blue light-emitting diode chip 922B. The difference between the embodiments of FIG. 12 and the embodiments of FIG. 10. is that the number of the first blue light-emitting diode chips 912B is same as the number of the first green light-emitting diode chips 912G. For example, the number of the first green light-emitting diode chips 912G and the first blue light-emitting diode chips 912B may be 2 respectively, and the number of the first red light-emitting diode chip 912R may be 1. The number of the second green light-emitting diode chips 922G and the second blue light-emitting diode chips 922B may be 2 respectively, and the number of the second red light-emitting diode chip 922R may be 1. The size of the first red light-emitting diode chip 912R and the second red light-emitting diode chip 922R may be larger than the first green light-emitting diode chips 912G, the first blue light-emitting diode chips 912B, the second green light-emitting diode chips 922G and the second blue light-emitting diode chip 922B. The carrier 902, the first light-emitting diode chips 912 of the first packages 910, the second light-emitting diode chips 922 of the second packages 920 are similar to or the same as the carrier 102, the first light-emitting diode chips 112 of the first packages 110, the second light-emitting diode chip 122 of the second packages 122 mentioned above; therefore detailed description are not described herein. For clarity, light-emitting diode chips emitting light with same color are represented by same screentones in FIG. 12.

The first packages 910 and the second packages 920 of the display device 900 are alternately arranged along the first direction D1, and the same packages (such as the first packages 910 or the second packages 920) are arranged along the second direction D2. Any of the first green light-emitting diode chips 912G, the first red light-emitting diode chip 912R and any of the first blue light-emitting diode chips 912B are arranged along the first direction D1 in sequence. Two first green light-emitting diode chips 912G are aligned with each other in the second direction D2 and two first blue light-emitting diode chips 912B are aligned with each other in the second direction D2. Any of the second blue light-emitting diode chips 922B, the second red light-emitting diode chip 922R and any of the second green light-emitting diode chips 922G are arranged along the first direction D1 in sequence. Two second green light-emitting diode chips 922G are aligned with each other in the second direction D2 and two second blue light-emitting diode chips 922B are aligned with each other in the second direction D2. That is, the sequence of arrangement of the first light-emitting diode chips 912 of the first packages 910 is opposite to the sequence of arrangement of the second light-emitting diode chips 922 of the second packages 920. When the arrangement of the first packages 910 and the second packages 920 are shown as FIG. 12, the first light-emitting diode chips 912 of the first packages 910 are adjacent to the light-emitting diode chips (the first light-emitting diode chips 912 or the second light-emitting diode chips 922) of the adjacent packages (the first packages 910 or the second packages 920) with similar wavelength. For example, the first green light-emitting diode chip 912G is adjacent to another first green light-emitting diode chips 912G in the second direction D2 and is adjacent to the second green light-emitting diode chips 922G in the first direction D1 (as shown by the light-emitting diode chips framed by the dashed line G9 in FIG. 12). The first blue light-emitting diode chip 912B is adjacent to another first blue light-emitting diode chips 912B in the second direction D2 and is adjacent to the second blue light-emitting diode chips 922B in the first direction D1 (as shown by the light-emitting diode chips framed by the dashed line B9 in FIG. 12). Arranging light-emitting diode chips with similar wavelength at adjacent locations may develop light mixing effect to reduce the color difference or brightness difference of the display device 900. The manufacturing cost of the display device 900 is also reduced.

Figure 13:
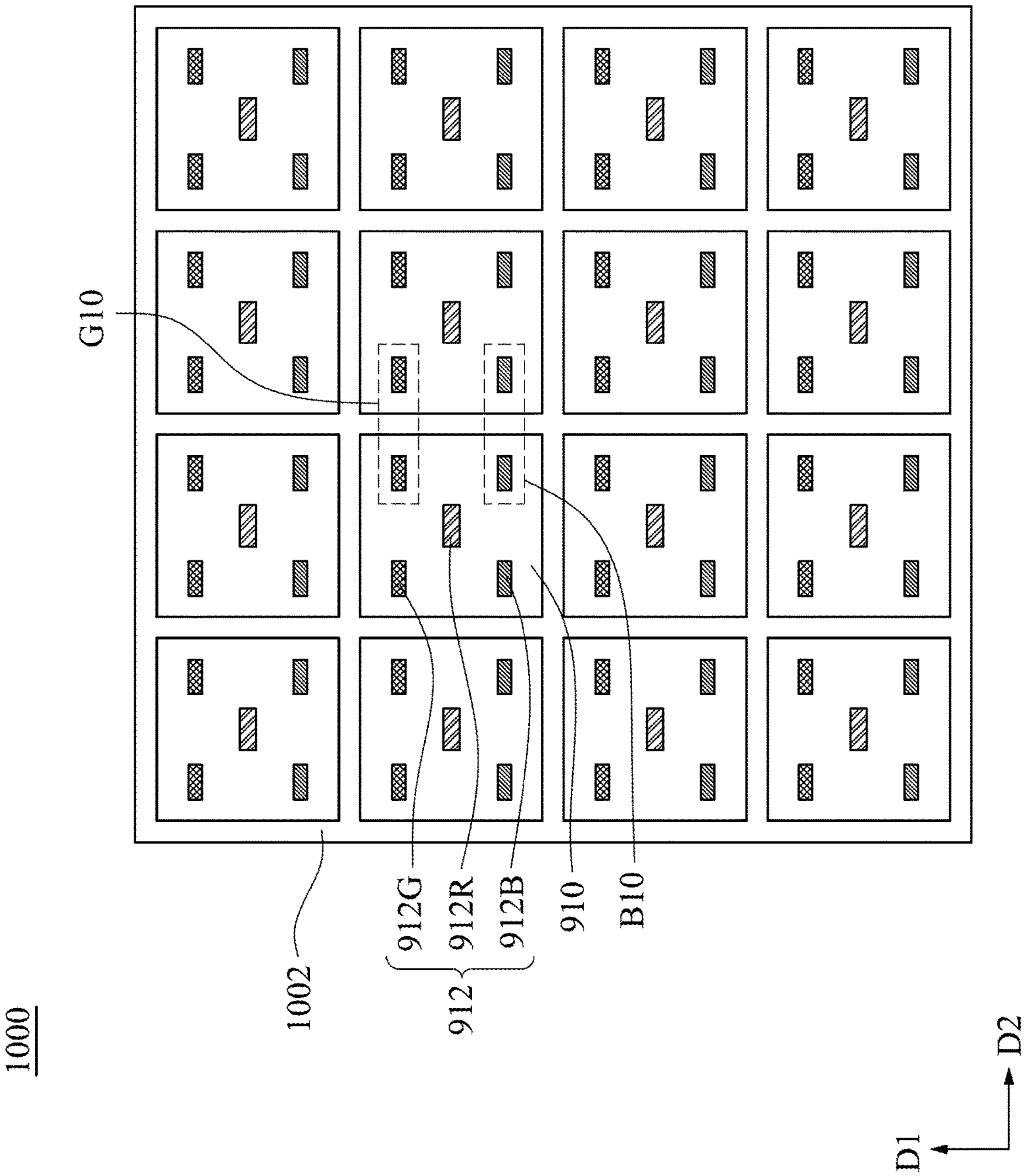
FIG. 13 illustrates a top view of a display device according to some embodiments of the present disclosure.

FIG. 13 illustrates a top view of the display device 1000 according to some embodiments of the present disclosure. The display device 1000 includes a carrier 1002 and a plurality of the first packages 910. The carrier 1002 and the first packages 910 of the display device 1000 are same as the carrier 902 and the first packages 910 of the display device 900. The difference between the display device 900 and the display device 1000 is that the second packages 920 of the display device 900 are replaced by the first packages 910 to form the display device 1000. For clarity, light-emitting diode chips emitting light with same color are represented by same screentones in FIG. 13.

When the arrangement of the first packages 910 is shown as FIG. 13, the first light-emitting diode chips of the first packages 910 with similar wavelength are adjacent to each other. For example, the first green light-emitting diode chips 912G are adjacent to each other (as shown by the light-emitting diode chips framed by the dashed line G10 in FIG. 13) in the second direction D2, and the first blue light-emitting diode chips 912B are adjacent to each other (as shown by the light-emitting diode chips framed by the dashed line B10 in FIG. 13) in the second direction D2. Arranging light-emitting diode chips with similar wavelength at adjacent locations may develop light mixing effect to reduce the color difference or brightness difference of the display device 1000. The manufacturing cost of the display device 1000 is also reduced.

As mentioned above, arranging light-emitting diode chips with similar wavelength together may develop light mixing effect to improve the mosaic or color difference issue. Moreover, using the arrangement of the light-emitting diode chips according to some embodiments of the disclosure may relax the specifications of the light-emitting diodes chips, thereby reducing the elimination rate of the light-emitting diode chips and reducing the manufacturing cost. In addition, although the chips mentioned above are chips in packages, the type of the chips is not limited. All the chips arranged in the arrangement according to some embodiments of the present disclosure may achieve the advantage of the present disclosure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A display device, comprising:

a carrier;

a plurality of first packages on the carrier, each of the first packages comprising a plurality of first light-emitting diode chips;

a plurality of second packages on the carrier, wherein each of the second packages comprises a plurality of second light-emitting diode chips, the first packages and the second packages are alternately arranged along a first direction, and an arrangement of the first light-emitting diode chips in the first packages is different from an arrangement of the second light-emitting diode chips in the second packages, the first light-emitting diode chips of each of the first packages comprise a first green light-emitting diode chip, a first red light-emitting diode chip and a first blue light-emitting diode chip arranged sequentially along a second direction different from the first direction, and the second light-emitting diode chips of each of the second packages comprise a second green light-emitting diode chip and a second blue light-emitting diode chip arranged sequentially along the second direction;

a plurality of third packages on the carrier, wherein each of the third packages comprises a plurality of third light-emitting diode chips, the first packages and the third packages are alternately arranged along the second direction, and the arrangement of the first light-emitting diode chips in the first packages is different from an arrangement of the third light-emitting diode chips in the third packages; and a plurality of fourth packages on the carrier, wherein each of the fourth packages comprises a plurality of fourth light-emitting diode chips, the second packages and the fourth packages are alternately arranged along the second direction, and the arrangement of the second light-emitting diode chips in the second packages is different from an arrangement in the fourth light-emitting diode chips of the fourth packages.

2. The display device of claim 1, wherein one of the first light-emitting diode chips and one of the second light-emitting diode chips are adjacent to each other, and configured to emit a same color light.

3. The display device of claim 1, wherein the plurality of second light-emitting diode chips further comprises a second red light-emitting diode chip, and the second green light-emitting diode chip, the second red light-emitting diode chip and the second blue light-emitting diode chip arranged sequentially along the first direction.

4. The display device of claim 3, wherein a connecting line of centers of the first green light-emitting diode chip, the first red light-emitting diode chip and the first blue light-emitting diode chip of each of the first packages is parallel to the first direction.

5. The display device of claim 3, wherein a connecting line of centers of the first green light-emitting diode chip, the first red light-emitting diode chip and the first blue light-emitting diode chip and the first direction forms an acute angle.

6. The display device of claim 1, wherein the first green light-emitting diode chip and the first blue light-emitting diode chip of each of the first packages are at opposite corners of each of the first packages.

7. The display device of claim 1, wherein the second green light-emitting diode chip and the second blue light-emitting diode chip of each of the second packages are at opposite corners of each of the second packages, and the second blue light-emitting diode chip is aligned with the first blue light-emitting diode chip along the first direction.

8. The display device of claim 1, wherein a number of the first light-emitting diode chips of each of the first packages is more than a number of the second light-emitting diode chips of each of the second packages.

9. The display device of claim 1, wherein the first green light-emitting diode chip and the first blue light-emitting diode chip are at a first side of the first package, and the first red light-emitting diode chip is at a second side opposite to the first side of the first package.

10. The display device of claim 9, wherein one of the first light-emitting diode chips of the first packages and one of the second light-emitting diode chips of the second packages are adjacent to each other, and configured to substantially emit same color light.

11. The display device of claim 1, wherein the first green light-emitting diode chip is adjacent to the second green light-emitting diode chip and, the first blue light-emitting diode chip is adjacent to the second blue light-emitting diode chip.

12. The display device of claim 1, wherein the first light-emitting diode chips of the first packages are next to the third light-emitting diode chips of the third packages.

13. The display device of claim 1, wherein the third light-emitting diode chips comprise a third blue light-emitting diode chip, a third red light-emitting diode chip and a third green light-emitting diode chip arranged sequentially along the second direction.

14. The display device of claim 13, wherein the third green light-emitting diode chip is aligned with the first green light-emitting diode chip along the second direction, and the third blue light-emitting diode chip is aligned with the first blue light-emitting diode chip along the second direction and not aligned with the first red light-emitting diode chip.

15. The display device of claim 14, wherein the third green light-emitting diode chip is adjacent to the first green light-emitting diode chip.

16. The display device of claim 14, wherein the third green light-emitting diode chip is adjacent to the first green light-emitting diode chip and the third blue light-emitting diode chip is adjacent to the first blue light-emitting diode chip.

17. The display device of claim 1, wherein the fourth light-emitting diode chips comprise:
- a fourth green light-emitting diode chip; and
- a fourth blue light-emitting diode chip and the fourth blue light-emitting diode chip arranged sequentially along the second direction.

18. The display device of claim 1, wherein during a display operation, one of the first packages is adjacent to one of the second packages, according to a display information, the one of the first packages forms a pixel, and the first red light-emitting diode chip of the one of the first packages is configured to cooperate with the second blue light-emitting diode chip and the second green light-emitting diode chip of the one of the second packages adjacent to the one of the first packages to form anther pixel.

* * * * *